United States Patent
Inazu et al.

(10) Patent No.: US 8,822,976 B2
(45) Date of Patent: Sep. 2, 2014

(54) NITRIDE SEMICONDUCTOR ULTRAVIOLET LIGHT-EMITTING ELEMENT

(75) Inventors: Tetsuhiko Inazu, Aichi (JP); Cyril Pernot, Aichi (JP); Akira Hirano, Aichi (JP)

(73) Assignee: Soko Kagaku Co., Ltd., Aichi (JP)

( * ) Notice: Subject to any disclaimer, the term of this patent is extended or adjusted under 35 U.S.C. 154(b) by 0 days.

(21) Appl. No.: 14/001,342

(22) PCT Filed: Mar. 23, 2011

(86) PCT No.: PCT/JP2011/057023
§ 371 (c)(1),
(2), (4) Date: Aug. 23, 2013

(87) PCT Pub. No.: WO2012/127660
PCT Pub. Date: Sep. 27, 2012

(65) Prior Publication Data
US 2013/0328013 A1    Dec. 12, 2013

(51) Int. Cl.
*H01L 29/06* (2006.01)
*H01L 33/40* (2010.01)
*H01L 33/10* (2010.01)
*H01L 33/38* (2010.01)
*H01L 33/32* (2010.01)

(52) U.S. Cl.
CPC ............. *H01L 33/10* (2013.01); *H01L 33/405* (2013.01); *H01L 33/382* (2013.01); *H01L 33/32* (2013.01); *H01L 2933/0016* (2013.01)
USPC ............................................. 257/13; 257/98

(58) Field of Classification Search
CPC ....... H01L 33/32; H01L 33/382; H01L 33/10; H01L 33/405
USPC .................................... 257/13, 98
See application file for complete search history.

(56) References Cited

U.S. PATENT DOCUMENTS 7,675,075 B2 *   3/2010  Nagai ............................ 257/90
2005/0156185 A1  7/2005  Kim et al.

(Continued)

FOREIGN PATENT DOCUMENTS

JP    2001168381 A    6/2001
JP    2004146538 A    5/2004
JP    2006066556 A    3/2006

OTHER PUBLICATIONS

Nagamatsu, Kentaro, et al., "High-efficiency AlGaN-based UV light-emitting diode on laterally overgrown AlN," Journal of Crystal Growth, 2008, 310, pp. 2326-2329.

(Continued)

*Primary Examiner* — Trung Q Dang
(74) *Attorney, Agent, or Firm* — Haynes Beffel & Wolfeld LLP

(57) ABSTRACT

A nitride semiconductor ultraviolet light-emitting element is formed by laminating at least an n-type cladding layer configured of an n-type AlGaN semiconductor layer, an active layer including an AlGaN semiconductor layer having band gap energy of 3.4 eV or larger, and a p-type cladding layer configured of a p-type AlGaN semiconductor layer. A p-type contact layer configured of a p-type AlGaN semiconductor layer that absorbs ultraviolet light emitted from the active layer is formed on the p-type cladding layer. The p-type contact layer has an opening portion penetrating through to a surface of the p-type cladding layer. A p-electrode metal layer that makes Ohmic contact or non-rectifying contact with the p-type contact layer is formed on the p-type contact layer so as not to completely block the opening portion. A reflective metal layer for reflecting the ultraviolet light is formed at least on the opening portion and covers the surface of the p-type cladding layer that is exposed through the opening portion either directly or through a transparent insulating layer that allows the ultraviolet light to pass therethrough.

13 Claims, 26 Drawing Sheets

(56) References Cited

U.S. PATENT DOCUMENTS

| | | | |
|---|---|---|---|
| 2007/0181889 A1* | 8/2007 | Orita | 257/79 |
| 2008/0123711 A1 | 5/2008 | Chua et al. | |
| 2008/0144688 A1 | 6/2008 | Chua et al. | |
| 2009/0057707 A1 | 3/2009 | Katsuno et al. | |
| 2009/0090932 A1 | 4/2009 | Bour et al. | |
| 2010/0051978 A1* | 3/2010 | Katsuno et al. | 257/94 |
| 2012/0161104 A1* | 6/2012 | Okamoto et al. | 257/13 |
| 2014/0103289 A1* | 4/2014 | Liao et al. | 257/13 |

OTHER PUBLICATIONS

Sumiya, Shigeaki, et al., "AlGaN-Based Deep Ultraviolet Light-Emitting Diodes Grown on Epitaxial AlN/Sapphire Templates," Japanese Journal of Applied Physics, Bol. 47, No. 1, 2008, pp. 43-46.

Lobo, N., et al., "Enhancement of light extraction in ultraviolet light-emitting diodes using nanopixel contact design with Al reflector," Applied Physics Letters, 96, 081109, 2010, 4 pg.

* cited by examiner

|  | Light Emission Output P [mW] | Forward Voltage Vf [V] | Conversion Efficiency E |
| --- | --- | --- | --- |
| Example 1 | 7.55 (129%) | 7.41 (119%) | 1.70 |
| Example 2 | 7.61 (130%) | 7.90 (127%) | 1.61 |
| Example 3 | 7.70 (132%) | 7.81 (125%) | 1.64 |
| Comparative Example | 5.85 | 6.23 | 1.57 |

Fig. 12

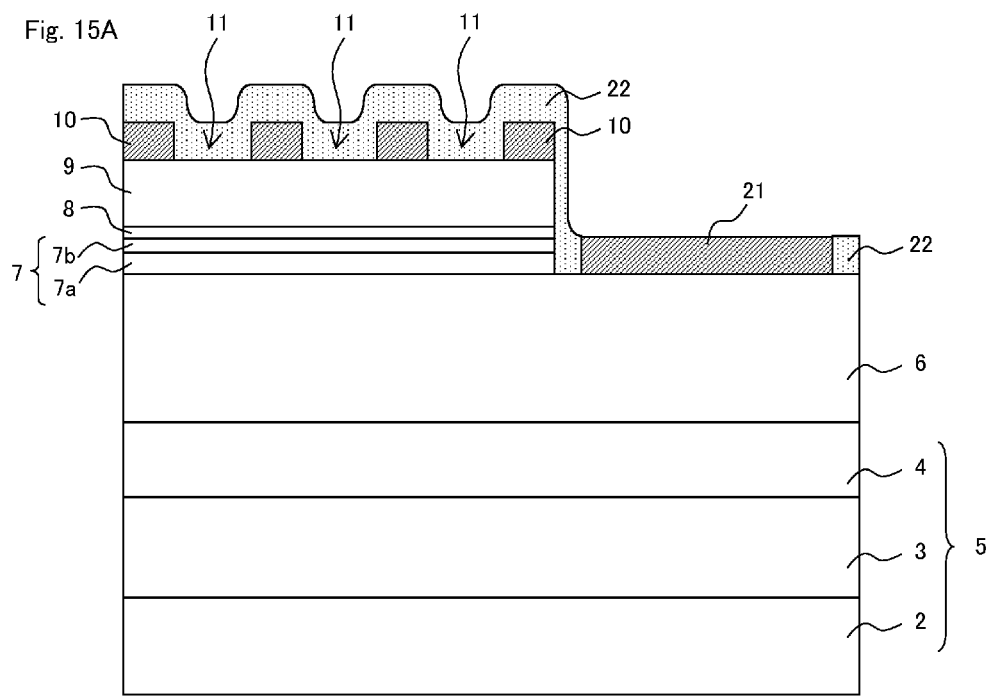
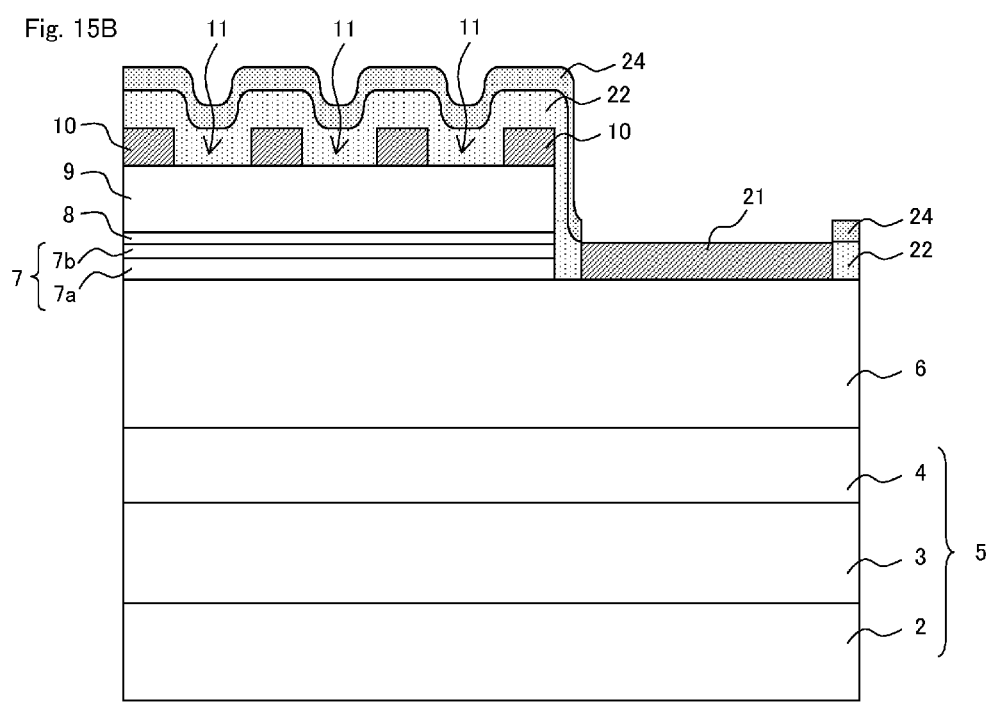

NITRIDE SEMICONDUCTOR ULTRAVIOLET LIGHT-EMITTING ELEMENT

CROSS-REFERENCE TO RELATED APPLICATIONS

This application is a National Phase filing under 35 U.S.C. §371 of International Application No. PCT/JP2011/057023 filed on Mar. 23, 2011.

TECHNICAL FIELD

The present invention relates to a nitride semiconductor ultraviolet light-emitting element used for a light-emitting diode, a laser diode, and the like, and having a center emission wavelength of about 355 nm or smaller, and relates, in particular, to a technique for improving external quantum efficiency.

BACKGROUND ART

Conventionally, as a GaN nitride semiconductor, a light-emitting element and a light-receiving element having a multilayer structure based on a GaN layer or an AlGaN layer having a relatively small AlN molar fraction (also referred to as AlN mixed crystal ratio or Al composition ratio) are produced (see, for example, Non-Patent Documents 1 and 2). FIG. 26 illustrates a typical crystal layer structure of a GaN light-emitting diode. The light-emitting diode illustrated in FIG. 26 has a laminated structure in which, after an underlying layer 102 of AlN is formed on a sapphire substrate 101, and then a periodic groove pattern is formed thereon by photolithography and reactive ion etching, an ELO (Epitaxial Lateral Overgrowth)-AlN layer 103 is formed as a template; and an n-type cladding layer 104 of n-type AlGaN having a thickness of 2 μm, an AlGaN/GaN multi-quantum well active layer 105, a p-type AlGaN electron block layer 106 having an Al composition ratio which is larger than that of the multi-quantum well active layer 105 and having a thickness of 20 nm, a p-type cladding layer 107 of p-type AlGaN having a thickness of 50 nm, and a p-type GaN contact layer 108 having a thickness of 20 nm are sequentially stacked on the ELO-AlN template 103. The multi-quantum well active layer 105 has a five-layered structure including a GaN well layer having a film thickness of 2 nm and sandwiched by AlGaN barrier layers having a film thickness of 8 nm. After crystal growth, in order to partially expose a surface of the n-type cladding layer 104, the multi-quantum well active layer 105, the electron block layer 106, the p-type cladding layer 107, and the p-type contact layer 108 thereon are etched off. A p-electrode 109 of Ni/Au is formed on a surface of the p-type contact layer 108, for example, and an n-electrode 110 of Ti/Al/Ti/Au is formed on the surface of the exposed n-type cladding layer 104, for example. By arranging a GaN well layer into an AlGaN well layer, and changing the AlN molar fraction or the thickness of the AlGaN well layer, the emission wavelength is made shorter, or by adding In, the emission wavelength is made longer, so that a light-emitting diode in an ultraviolet region having a wavelength of about 200 nm to 400 nm can be produced. A semiconductor laser can also be produced in a similar manner.

Light emitted from the active layer propagates in all directions, i.e., toward a side of the n-type cladding layer and a side of the p-type cladding layer. Therefore, in case of the nitride semiconductor light-emitting element in which light having passed through the n-type cladding layer is extracted from a rear side thereof, if part of the light propagating on the side of the p-type cladding layer reaches an interface with the p-electrode and reflected thereby without being absorbed by the p-type contact layer, the reflected light propagates toward the n-type cladding layer and is effectively used. By configuring in such a way that the light propagating toward the side of the p-type cladding layer is reflected and returned to the side of the n-type cladding layer with high efficiency, an amount of light extracted from the nitride semiconductor light-emitting element increases, and therefore the external quantum efficiency of the element is enhanced.

An attempt to improve the external quantum efficiency by efficiently reflecting light propagating on a side of a p-type cladding layer is disclosed in Patent Documents 1 and 2, and Non-Patent Document 3 described below.

According to the technique disclosed in Patent Document 1, a p-electrode to be electrically connected to a p-type contact layer is formed in a mesh pattern having apertures on the p-type contact layer, and a reflective layer using a metal such as silver or Al is formed on the p-type contact layer exposed in the apertures and the p-electrode, so that the external quantum efficiency is improved by providing a structure in which light having passed through a p-type cladding layer and a p-type contact layer is reflected toward the side of the active layer by the reflective layer formed in the apertures.

According to the technique disclosed in Patent Document 2, a high reflectivity metal layer making Ohmic contact with a p-type nitride semiconductor layer and having a mesh pattern with apertures is provided on the p-type nitride semiconductor layer, and further a metal barrier layer for assisting the reflection of the high reflectivity metal layer is provided on the p-type nitride semiconductor layer exposed in the apertures and the high reflectivity metal layer, so that the external quantum efficiency is improved by providing a structure in which light having passed through the p-type nitride semiconductor layer is reflected by an interface between the high reflectivity metal layer and the metal barrier layer.

According to the technique disclosed in Non-Patent Document 3, Pd electrodes of a nano-pixel type making Ohmic contact with a p-type nitride semiconductor layer are provided on the p-type nitride semiconductor layer, and further an Al reflective layer is formed in a gap between the Pd electrodes, so that the external quantum efficiency is improved by providing a structure in which light having passed through the p-type nitride semiconductor layer is reflected toward an active layer by the reflective layer formed in the gap.

PRIOR ART DOCUMENT

Patent Document

Patent Document 1: Japanese Unexamined Patent Application Publication No. 2008-66727
Patent Document 2: Japanese Unexamined Patent Application Publication No. 2005-210051

Non-patent Document

Non-patent Document 1: Kentaro Nagamatsu, et al., "High-efficiency AlGaN-based UV light-emitting diode on laterally overgrown AlN," Journal of Crystal Growth, 2008, 310, pp. 2326-2329
Non-patent Document 2: Shigeaki Sumiya, et al., "AlGaN-Based Deep Ultraviolet Light-Emitting Diodes Grown on Epitaxial AlN/Sapphire Templates," Japanese Journal of Applied Physics, Vol. 47, No. 1, 2008, pp. 43-46

Non-patent Document 3: N. Lobo, et al., "Enhancement of light extraction in ultraviolet light-emitting diodes using nanopixel contact design with Al reflector," Applied Physics Letters, 96, 081109, 2010

SUMMARY OF THE INVENTION

Problems to be Solved by the Invention

A nitride semiconductor ultraviolet light-emitting element has a double hetero structure in which an active layer (light-emitting layer) is held between a p-type cladding layer and an n-type cladding layer, an emission wavelength is determined by a band gap energy (band gap) of the active layer, an AlN molar fraction x of $Al_xGa_{1-x}N$ which constitutes each of the cladding layers is set larger than that of the active layer. As a result, the AlN molar fraction of each of the cladding layers becomes larger due to a shorter wavelength of the emission wavelength. For example, in the case where the center emission wavelength is around 280 nm, the AlN molar fraction of each of the cladding layers becomes about 60%, and, in the case where the center emission wavelength is around 250 nm, the AlN molar fraction of each of the cladding layers becomes about 75%.

When each of the AlN molar fractions of the p-type and n-type cladding layers configured of the AlGaN layer becomes larger, respective Ohmic contacts to the p-electrode and the n-electrode with a low resistance becomes difficult. Particularly, for the p-type cladding layer, when the AlN molar fraction exceeds 10% and becomes larger, high resistivity thereof becomes noticeable. For this reason, in the nitride semiconductor ultraviolet light-emitting element, the p-electrode is not normally formed directly on the p-type cladding layer. Instead, however, as illustrated in FIG. 26, a p-type contact layer of p-type GaN or the like that can make Ohmic contact with the p-electrode with a low resistance is formed on the p-type cladding layer, and the p-electrode is formed on the p-type contact layer.

In all of the techniques to improve the external quantum efficiency disclosed in Patent Documents 1 and 2, and Non-Patent Document 3, a metal electrode having openings that are partially opened for making Ohmic contact with a p-type nitride semiconductor layer is provided on the p-type nitride semiconductor layer that forms an uppermost layer of the nitride semiconductor layer constituting a light-emitting element. The p-type nitride semiconductor layer that forms an uppermost layer is formed on an entire area above the active layer. Accordingly, for reflecting emitted light from the active layer by the reflective layer and the high reflectivity metal layer formed thereabove, it is necessary to arrange so that the emitted light is not absorbed by the p-type nitride semiconductor layer.

However, for the metal electrode to make excellent Ohmic contact with the p-type nitride semiconductor layer, it is necessary that the uppermost layer be made of p-type GaN or AlGaN having an AlN molar fraction smaller than 10%. In particular, Patent Document 1 describes that it is necessary to use the p-type GaN, and Non-Patent Document 3 describes an embodiment using p-type GaN as the p-type nitride semiconductor layer of the uppermost layer. In such a case, when the emission wavelength from the active layer is about 355 nm or smaller, or further shorter wavelength, the light emission from the active layer is absorbed by the p-type nitride semiconductor layer of the uppermost layer. As a result, the light emission does not reach the reflective layer or the high reflectivity metal layer, or even if part of the light reaches there, reflected light is absorbed when it passes through the p-type nitride semiconductor layer again. Accordingly, the light is not effectively used, and therefore the external quantum efficiency is not improved. Consequently, the techniques for improving the external quantum efficiency disclosed in Patent Documents 1 and 2, and Non-Patent Document 3 are not effective for the light-emitting element having an emission wavelength of 355 nm or smaller.

The present invention is made in view of the foregoing problem, and it is an object of the present invention to improve external quantum efficiency of a nitride semiconductor light-emitting element having a center emission wavelength of 355 nm or smaller.

Means for Solving the Problem

To achieve the object described above, the present invention provides a nitride semiconductor ultraviolet light-emitting element, in accordance with a first aspect, formed by laminating at least an n-type cladding layer configured of an n-type AlGaN semiconductor layer, an active layer including an AlGaN semiconductor layer having band gap energy of 3.4 eV or larger, and a p-type cladding layer configured of a p-type AlGaN semiconductor layer, wherein a p-type contact layer configured of a p-type AlGaN semiconductor layer that absorbs ultraviolet light emitted from the active layer is formed on the p-type cladding layer; the p-type contact layer has an opening portion penetrating through to a surface of the p-type cladding layer; a p-electrode metal layer that makes Ohmic contact or non-rectifying contact with the p-type contact layer is formed on the p-type contact layer in a manner not to completely block the opening portion; a reflective metal layer for reflecting the ultraviolet light is formed at least on the opening portion; and the reflective metal layer covers the surface of the p-type cladding layer that is exposed through the opening portion either directly or through a transparent insulating layer that allows the ultraviolet light to pass therethrough.

In the present invention, the AlGaN semiconductor is based on a ternary compound (or binary compound) represented by a general formula of $Al_xGa_{1-x}N$ (x represents AlN molar fraction, where $0 \leq x \leq 1$), and is a group-III nitride semiconductor having band gap energy larger than band gap energy (about 3.4 eV) of GaN (where x=0), and includes a case where a minute amount of In is contained as long as a condition of the band gap energy is satisfied.

According to the nitride semiconductor ultraviolet light-emitting element in accordance with the first aspect, part of the ultraviolet light emitted from the active layer, passed through the p-type cladding layer, and having a center emission wavelength of 355 nm or smaller, enters the opening portion of the p-type contact layer, and reliably reaches and is reflected by the reflecting metal layer without being absorbed by the p-type contact layer, so that the reflected light can be effectively used, and external quantum efficiency can be improved.

Further, since the p-type contact layer and the p-electrode metal layer make Ohmic contact or non-rectifying contact with each other, a current path leading from the p-electrode metal layer through the p-type contact layer and the p-type cladding layer to the active layer is provided. The inventors of the present invention checked in the examples which will be described later that the current path was sufficiently provided, and excellent light emission was performed even if the p-type contact layer was not formed entirely above the active layer. In the nitride semiconductor ultraviolet light-emitting element having a center emission wavelength of 355 nm or smaller, an AlN molar fraction of the p-type cladding layer increases beyond 10%, and the p-type cladding layer cannot make Ohmic contact or non-rectifying contact with the p-electrode metal layer with a low resistance. Therefore, there is a meaning for providing a p-type contact layer that can make Ohmic contact or non-rectifying contact with the p-electrode metal layer.

In addition, in the nitride semiconductor ultraviolet light-emitting element in accordance with the first aspect, it is preferable that the AlN molar fraction of the p-type contact layer is 0% or larger and smaller than 10%. If the AlN molar fraction of the p-type contact layer is 0% or larger and smaller than 10%, it is possible to make Ohmic contact or non-rectifying contact with a low resistance with the p-electrode metal layer. Particularly, by using p-type GaN having an AlN molar fraction of 0%, it is possible to make excellent Ohmic contact with a low resistance.

Further, in the nitride semiconductor ultraviolet light-emitting element in accordance with the first aspect, it is preferable that the reflective metal layer is formed at least on the opening portion and the p-electrode metal layer. In the case where the p-electrode metal layers are discretely formed, by forming the reflective metal layer also on the p-electrode metal layers, it is possible to connect the discrete p-electrode metal layers with one another and cause them to function as an integrated p-electrode.

In the nitride semiconductor ultraviolet light-emitting element in accordance with the first aspect, it is preferable that the reflective metal layer is configured of Al, or a metal multilayer film or an alloy including Al as a main component.

Furthermore, in the nitride semiconductor ultraviolet light-emitting element in accordance with the first aspect, it is preferable that a ratio of an area of the opening portions to a total area of the p-type contact layer and the opening portions is 66% or larger. As the ratio is higher, an amount of reflected light increases and the external quantum efficiency increases accordingly. However, a parasitic resistance on a side of the p-electrode also increases, and a forward voltage increases to a higher voltage. Accordingly, when the ratio is too high, there may be a case where light-emitting efficiency with respect to power inputted between an anode and a cathode of the light-emitting element is reduced. When the ratio is 66%, the light-emitting efficiency is not reduced, and the external quantum efficiency can be improved within a range in which a practical forward voltage is realized. Since it is necessary to provide a certain area for the p-electrode metal layer so that a forward voltage is applied to the light-emitting element, a predetermined value smaller than 100% is determined as an upper limit of the ratio according to a range in which the area and a practical forward voltage can be realized.

Further, the nitride semiconductor ultraviolet light-emitting element in accordance with the first aspect has a second aspect in which the active layer, the p-type cladding layer, the p-type contact layer, and the reflective metal layer are formed in a first region on the n-type cladding layer in a plane parallel to a surface of the n-type cladding layer; an n-type contact layer configured of an n-type AlGaN semiconductor layer is formed in at least part of a second region other than the first region on the n-type cladding layer; an AlN molar fraction of the n-type contact layer is in a range of 0% or larger and 60% or smaller, and is smaller than an AlN molar fraction of the n-type cladding layer; and an n-electrode which makes Ohmic contact or non-rectifying contact with the n-type contact layer is formed on the n-type contact layer.

According to the nitride semiconductor ultraviolet light-emitting element of the second aspect, since the n-type contact layer having the AlN molar fraction which is in a range of 0% or larger and 60% or smaller, and is smaller than the AlN molar fraction of the n-type cladding layer is interposed between the n-type cladding layer and the n-electrode, the n-electrode and the n-type contact layer reliably make Ohmic contact with each other, and a contact resistance thereof is lower than a resistance when the n-electrode and the n-type cladding layer make direct contact with each other. For this reason, a parasitic resistance between the n-type cladding layer and the n-electrode can be suppressed, the forward voltage can be lowered, and, as a result, lower power consumption and a longer life of the light-emitting element can be achieved.

Further, in the nitride semiconductor ultraviolet light-emitting element according to the second aspect, it is preferable that the n-type contact layer is re-grown and formed on at least a surface of part of the n-type cladding layer in the second region. Since the n-type contact layer is formed by regrowth on the n-type cladding layer, there is no need to form the n-type contact layer under the n-type cladding layer in advance, and therefore emitted light can be extracted from a rear side. Here, the regrowth means that it is not a series of growth in which a crystal growth of the n-type cladding layer of the base and a crystal growth of the n-type contact layer are continuous.

Further, in the nitride semiconductor ultraviolet light-emitting element according to the second aspect, when the n-electrode is configured of a metal reflecting ultraviolet light, e.g., a metal multilayer film or an alloy including Al as a main component, it is possible to improve extraction efficiency of emitted light when it is extracted from the rear side. Similarly, by forming a reflective metal layer which is connected to the n-electrode and includes a metal reflecting a ultraviolet ray on the n-type cladding layer on which the n-type contact layer is not formed, it is possible to improve extraction efficiency of emitted light when it is extracted from the rear side. A certain amount of area in the second region of the n-type cladding layer is necessary to reduce a parasitic resistance in a current path leading from the active layer to the n-electrode. However, when the emitted light is extracted from the rear side, an amount of emitted light that can be actually extracted from the light-emitting element increases, and the external quantum efficiency is improved because light (ultraviolet ray) that is reflected, for example, by a surface of the substrate on a lower layer side is reflected again by the n-electrode in the second region on the n-type cladding layer or by the reflective metal layer.

Furthermore, in the nitride semiconductor ultraviolet light-emitting element according to the first or second aspect, it is preferable that the n-type cladding layer is formed on a template allowing the ultraviolet light to pass therethrough and configured of an insulator layer, a semiconductor layer, or a laminated body of the insulator layer and the semiconductor layer, and it is also preferable that the template includes an AlN layer. This arrangement makes it possible to allow the emitted light to pass through the template while the template is included, and extract the emitted light from the rear side.

Effect of the Invention

According to the nitride semiconductor ultraviolet light-emitting element having the aspects described above, it is also possible to reliably improve the external quantum efficiency for the emitted light having a center wave length of 355 nm or smaller, which was otherwise difficult by the conventional technique to improve the external quantum efficiency.

BRIEF DESCRIPTION OF THE DRAWINGS

FIG. 12 is a table indicating measurement results on emission intensity, forward voltage, and conversion efficiency of three kinds of examples of nitride semiconductor ultraviolet light-emitting elements according to the present invention and a comparative example which is provided with a p-type contact layer and a p-electrode on an entire p-type cladding layer but provided with no reflective metal layer.

FIG. 15 is a cross sectional view schematically illustrating a laminated structure in a manufacturing step (after an n-type contact layer is selectively grown) of the nitride semiconductor ultraviolet light-emitting element according to the second embodiment of the present invention.

MODE FOR CARRYING OUT THE INVENTION

Figure 1:
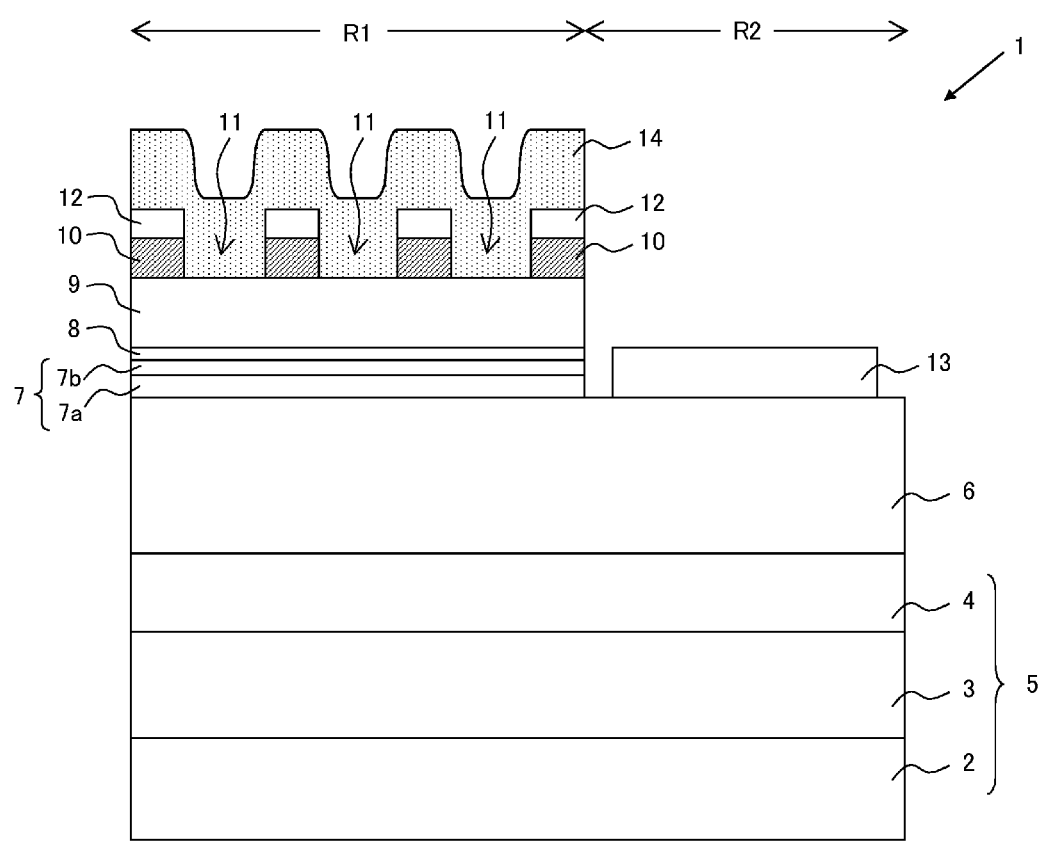
FIG. 1 is a cross sectional view schematically illustrating a laminated structure of a nitride semiconductor ultraviolet light-emitting element according to a first embodiment of the present invention.

An embodiment of a nitride semiconductor ultraviolet light-emitting element (hereinafter, arbitrarily referred to as "the element of the present invention") will be described with reference to the drawings. It should be noted that, since the invention is schematically illustrated by emphasizing a principal portion in the drawings used for the description to facilitate understanding of the description, dimensional proportions of individual portions are not necessarily equivalent to those of the actual element. Hereinafter, a description will be given by assuming that the element of the present invention is a light-emitting diode.

First Embodiment

As illustrated in FIG. 1, an element 1 of the present invention uses a substrate in which an AlN layer 3 and an AlGaN layer 4 are grown on a sapphire (0001) substrate 2 that serves as a template 5, and has a laminated structure formed by sequentially laminating, on the template 5, an n-type cladding layer 6 of n-type AlGaN, an active layer 7, an electron block layer 8 of p-type AlGaN whose AlN molar fraction is greater than that of the active layer 7, a p-type cladding layer 9 of p-type AlGaN, and a p-type contact layer 10 of p-type GaN. In the p-type contact layer 10, an opening 11 penetrating through to a surface of the p-type cladding layer 9 therebelow is formed by reactive ion etching or the like. The active layer 7, the electron block layer 8, the p-type cladding layer 9, and the p-type contact layer 10 are partially removed by reactive ion etching until a surface of the n-type cladding layer 6 is partially exposed, so that a laminated structure including layers starting from the active layer 7 to the p-type contact layer 10 is formed in a first region R1 on the n-type cladding layer 6. The active layer 7 has a single-layer quantum well structure configured of, as an example, an n-type AlGaN barrier layer 7a having a film thickness of 10 nm and a well layer 7b of AlGaN or GaN and having a film thickness of 3.5 nm. The active layer 7 may be of a double heterojunction structure sandwiched between n-type and p-type AlGaN layers having larger AlN molar fraction at lower and upper sides, or may be of a multi-quantum well structure resulted from multi-layering the single-layer quantum well structure.

Each of the AlGaN layers is formed by a well-known epitaxial growth method such as metalorganic vapor phase epitaxy (MOVPE) growth method or a molecular beam epitaxy (MBE) method; and, for example, Si is used as a donor impurity of an n-type layer, and, for example, Mg is used as an acceptor impurity of a p-type layer. It should be noted that the AlN layer and the AlGaN layer whose conductivity types are not described are undoped layers into which no impurities are injected. A film thickness of each of the AlGaN layers excluding the active layer 7 is, for example, 2000 nm for the n-type cladding layer 6, 2 nm for the electron block layer 8, 540 nm for the p-type cladding layer 9, and 200 nm for the p-type contact layer 10.

A p-electrode 12 made of, for example, Ni/Au is on a surface of the p-type contact layer 10, and an n-electrode 13 made of, for example, Ti/Al/Ti/Au is formed on a surface of the n-type cladding layer 6 in a second region R2 excluding the first region R1. In addition, a reflective metal layer 14 of Al is formed in the opening 11 of the p-type contact layer 10 and on the p-electrode 12. The reflective metal layer 14 may be a three-layer metal film of Al/Ti/Au instead of a single layer of Al. The p-type contact layer 10 and the p-electrode 12 are processed into a pattern such as a grid pattern (or mesh pattern), a comb-like pattern, or a dot-like pattern (island pattern), which partially covers the first region R1.

Figure 2A:
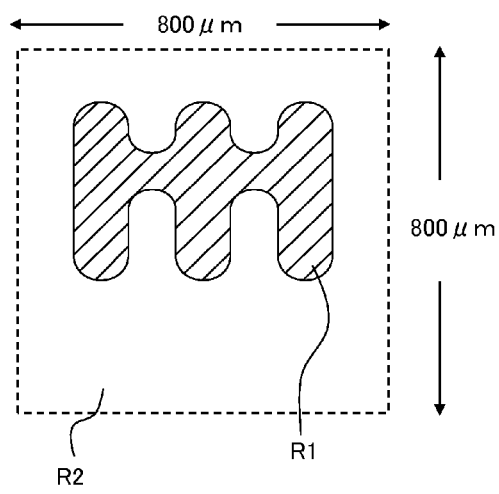
FIGS. 2A to 2D are plan views schematically illustrating a planar structure of the nitride semiconductor ultraviolet light-emitting element according to the first embodiment of the present invention and planar patterns of an n-electrode and a p-electrode.
Figure 2B:
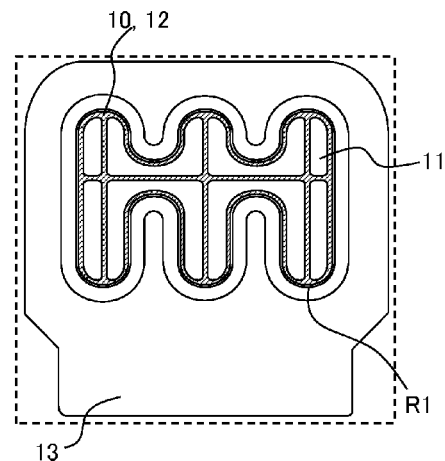
Figure 2C:
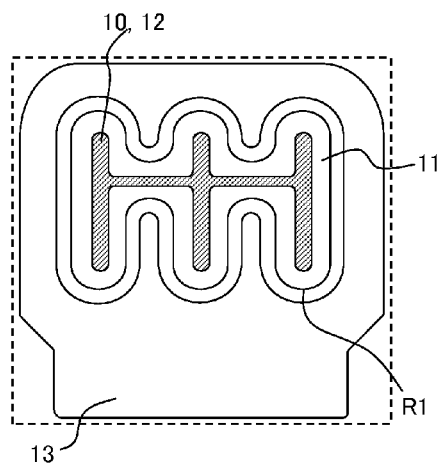
Figure 2D:
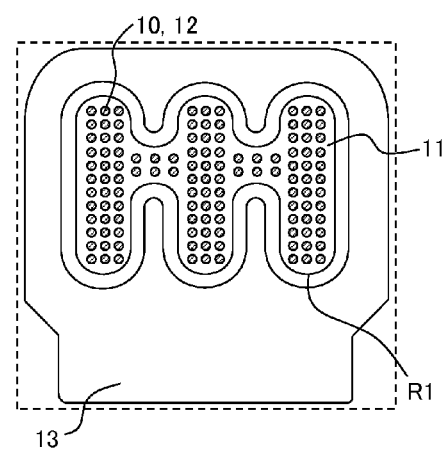

FIGS. 2A to 2D illustrate one example of a planar pattern of the p-electrode 12 and the n-electrode 13. FIG. 2A illustrates the first region R1 and the second region R2 prior to the formation of the p-electrode 12 and the n-electrode 13. A chip size of the element 1 of the present invention illustrated in FIGS. 2A to 2D is 800 μm both in height and width, and an area of the first region R1 is 168000 μm$^2$. FIGS. 2B to 2D illustrate the cases where the p-electrode 12 is in the grid pattern, the comb-like pattern, and the dot-like pattern, respectively, in which a portion of the p-electrode 12 is distinguished by cross-hatching.

According to the present embodiment, although the p-type contact layer 10 and the p-electrode 12 overlap each other with the same pattern, the p-electrode 12 may be slightly smaller than the p-type contact layer 10. Further, even if the p-electrode 12 is larger than the p-type contact layer 10 and covers a side face of a step of the p-type contact layer 10, it does not pose any problem as long as the opening portion 11 is present. A portion excluding the p-type contact layer 10 in the first region R1 is the opening portion 11. However, in the case where the p-electrode 12 is present in the opening portion 11, a portion in which the p-electrode 12 is not formed serves as an effective opening portion.

Figure 26:
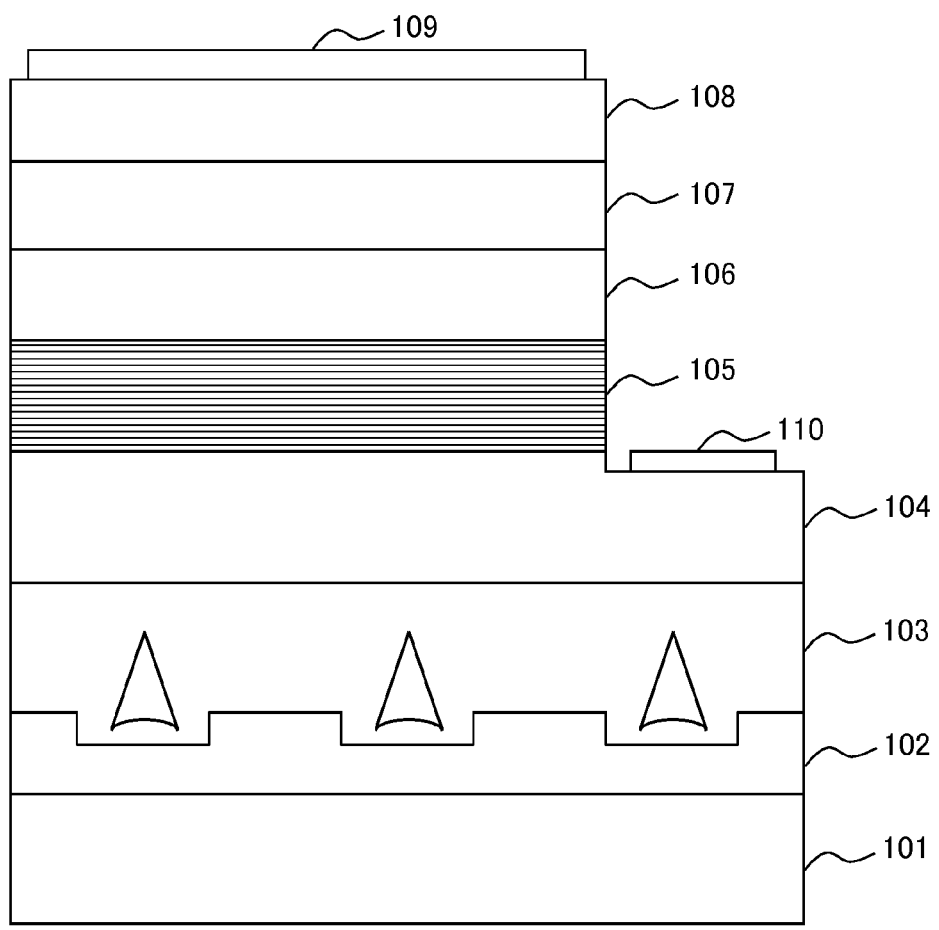
FIG. 26 is a cross sectional view schematically illustrating a crystal layer structure of a conventional AlGaN light-emitting diode.

The element structure illustrated in FIG. 1 is basically the same as the element structure of the conventional light-emitting diode illustrated in FIG. 26 except for the structures of the p-type contact layer 10 and the p-electrode 12, and the reflective metal layer 14. Accordingly, the element 1 of the present invention is characterized by the structures of the p-type contact layer 10 and the p-electrode 12, and the reflective metal layer 14.

Next, a method for manufacturing the element 1 of the present invention will be described. In particular, a method for manufacturing a portion of an p-electrode structure illustrated in FIG. 8 will be described in detail. FIGS. 3 to 8 illustrate cross sectional views in principal manufacturing steps.

Figure 3:
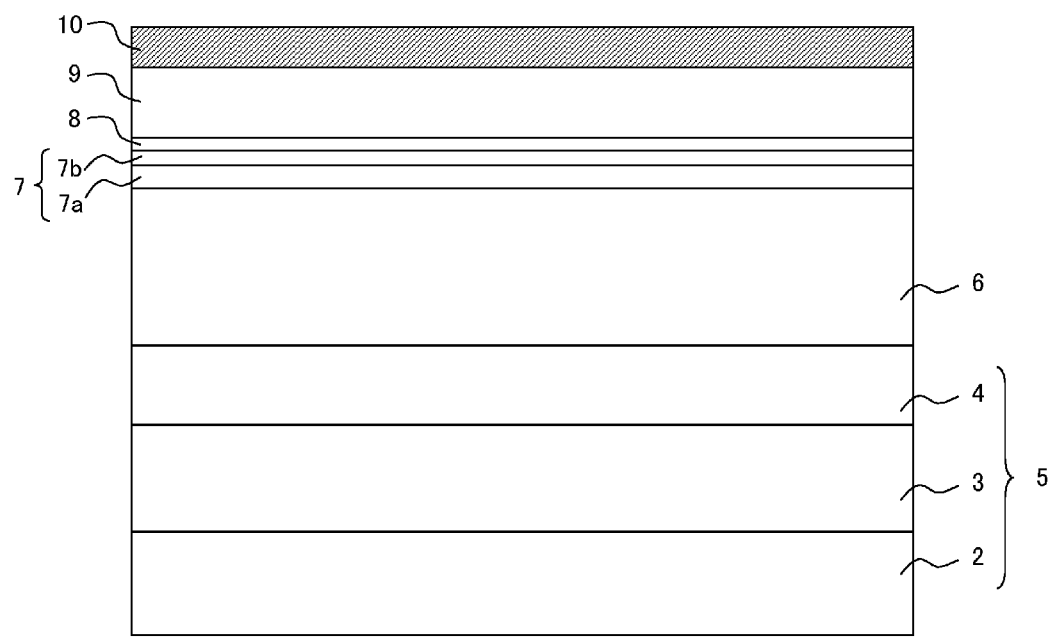
FIG. 3 is a cross sectional view schematically illustrating a laminated structure in a manufacturing step (after depositing a p-type contact layer) of the nitride semiconductor ultraviolet light-emitting element according to the first embodiment of the present invention.
Figure 4:
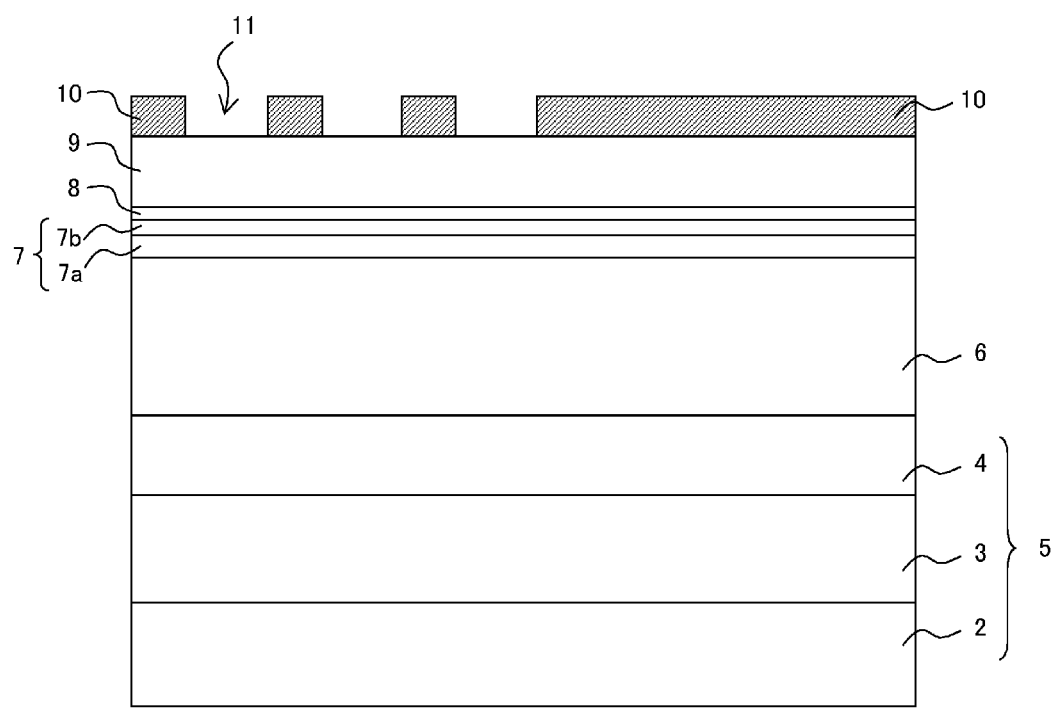
FIG. 4 is a cross sectional view schematically illustrating a laminated structure in a manufacturing step (after forming an opening) of the nitride semiconductor ultraviolet light-emitting element according to the first embodiment of the present invention.

First, as illustrated in FIG. 3, the template 5 and each layer starting from the n-type cladding layer 6 to the p-type contact layer 10 are formed by the well-known growth method as described above. After the p-type contact layer 10 is formed, heat treatment, for example, at 800° C. is applied for activating Mg which is an acceptor impurity. Next, as illustrated in FIG. 4, in a portion other than a portion in which the opening portion 11 is formed in the region R1 on a surface of the p-type contact layer 10 is covered with, for example, an Ni mask (not illustrated) by the well-known photolithography technique, the p-type contact layer 10 in a portion which is not covered with the Ni mask is removed by the well-known anisotropic etching method such as reactive ion etching until the p-type cladding layer 9 serving as a base is exposed so as to form the opening portion 11, and thereafter the Ni mask is removed.

Figure 5:
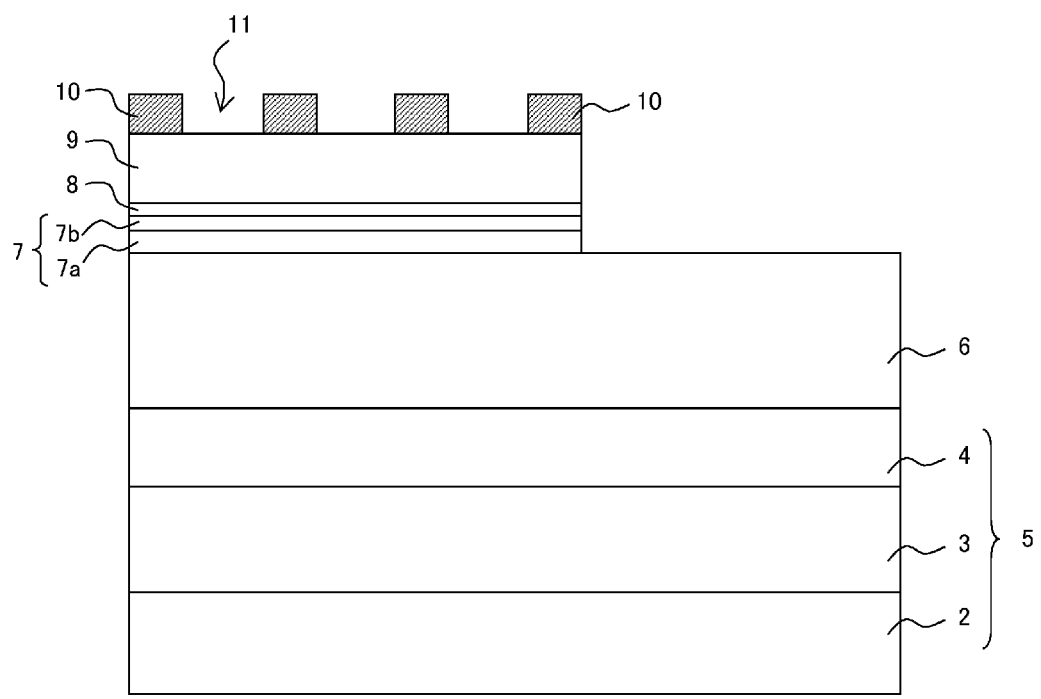
FIG. 5 is a cross sectional view schematically illustrating a laminated structure in a manufacturing step (after exposing a surface of an n-type cladding layer) of the nitride semiconductor ultraviolet light-emitting element according to the first embodiment of the present invention.
Figure 6:
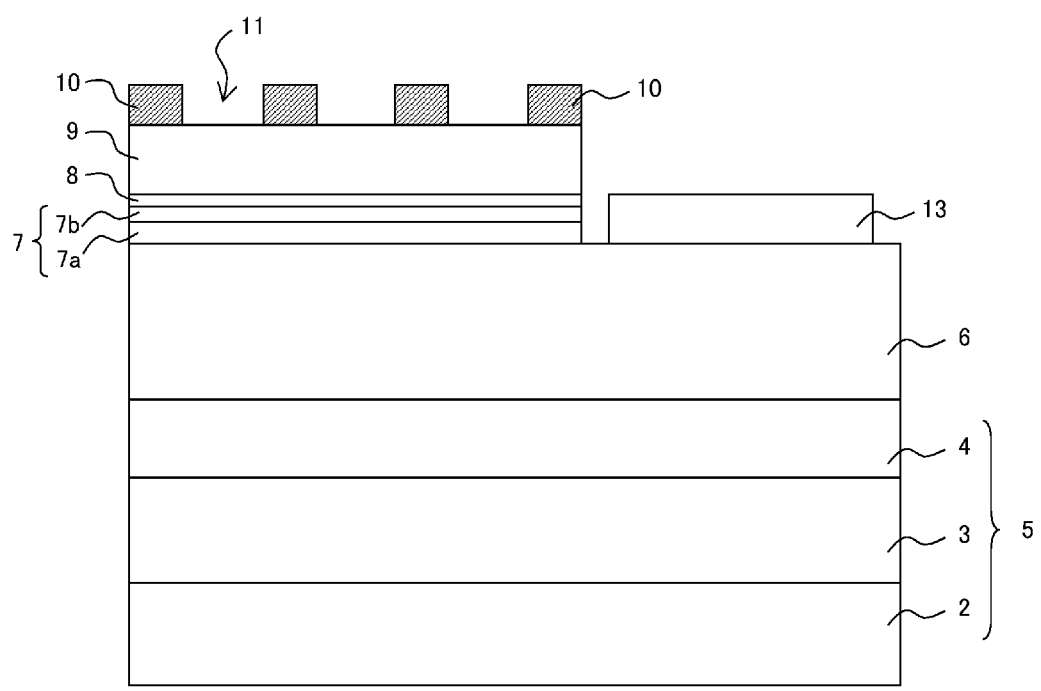
FIG. 6 is a cross sectional view schematically illustrating a laminated structure in a manufacturing step (after forming an n-electrode) of the nitride semiconductor ultraviolet light-emitting element according to the first embodiment of the present invention.

Next, as illustrated in FIG. 5, the first region R1 on the surface of the p-type contact layer is covered with, for example, an Ni mask (not illustrated) by the well-known photolithography technique, subsequently, a portion located in the second region R2 of each of layers starting from the active layer 7 to the p-type contact layer 10 deposited on an entire surface of the n-type cladding layer 6 is removed by the well-known anisotropic etching method such as reactive ion etching, and, after the surface of the n-type cladding layer 6 is exposed, the Ni mask is removed.

Subsequently, a photoresist (not illustrated) having a reverse pattern of that of the n-electrode 13 is formed on an entire surface of the substrate, a four-layer metal film of Ti/Al/Ti/Au serving as the n-electrode 13 is deposited thereon by an electron-beam evaporation method or the like, the four-layer metal film on the photoresist is exfoliated by removing the photoresist by a liftoff process, and heat treatment is applied as required by RTA (Rapid Thermal Annealing) or the like so as to form the n-electrode 13 on the n-type cladding layer 6. Film thicknesses of the four-layer metal film of Ti/Al/Ti/Au are, for example, 20 nm, 100 nm, 50 nm, and 100 nm, respectively, in this order.

Figure 7:
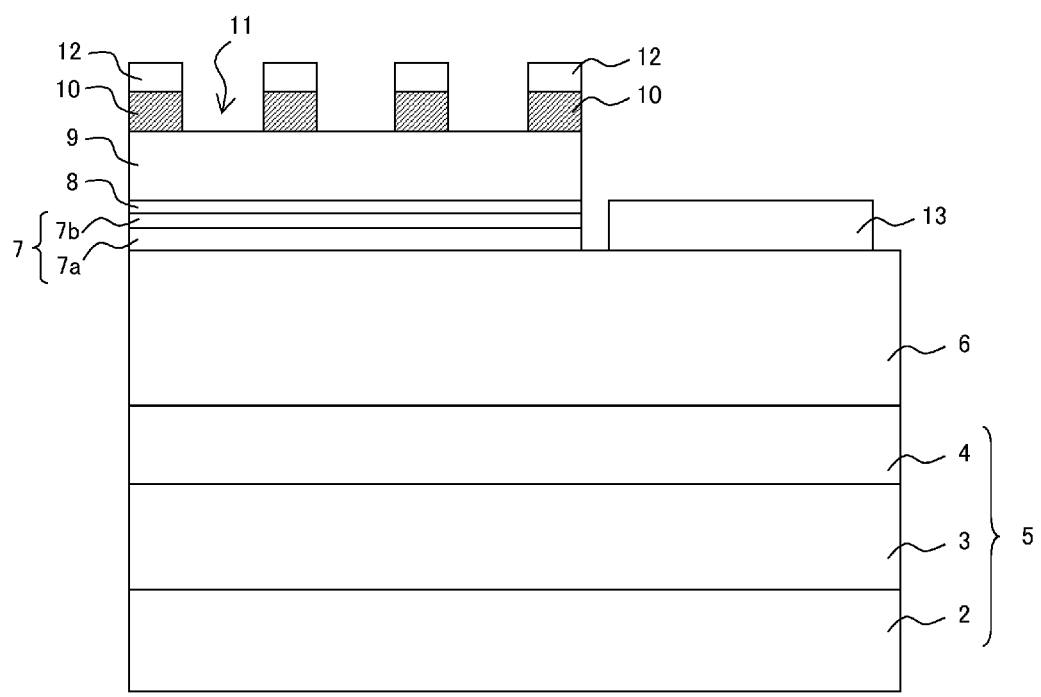
FIG. 7 is a cross sectional view schematically illustrating a laminated structure in a manufacturing step (after forming a p-electrode) of the nitride semiconductor ultraviolet light-emitting element according to the first embodiment of the present invention.

Thereafter, a photoresist (not illustrated) having a reverse pattern of that of the p-electrode 12 is formed on the entire surface of the substrate, a two-layer metal film of Ni/Au serving as the p-electrode 12 is deposited thereon by an electron-beam evaporation method or the like, the two-layer metal film on the photoresist is exfoliated by removing the photoresist by a liftoff process, and heat treatment at 450° C. is applied by RTA or the like so as to form the p-electrode 12 on the p-type contact layer 10, as illustrated in FIG. 7. Film thicknesses of the two-layer metal film of Ni/Au are, for example, 60 nm and 50 nm, respectively, in this order.

Figure 8:
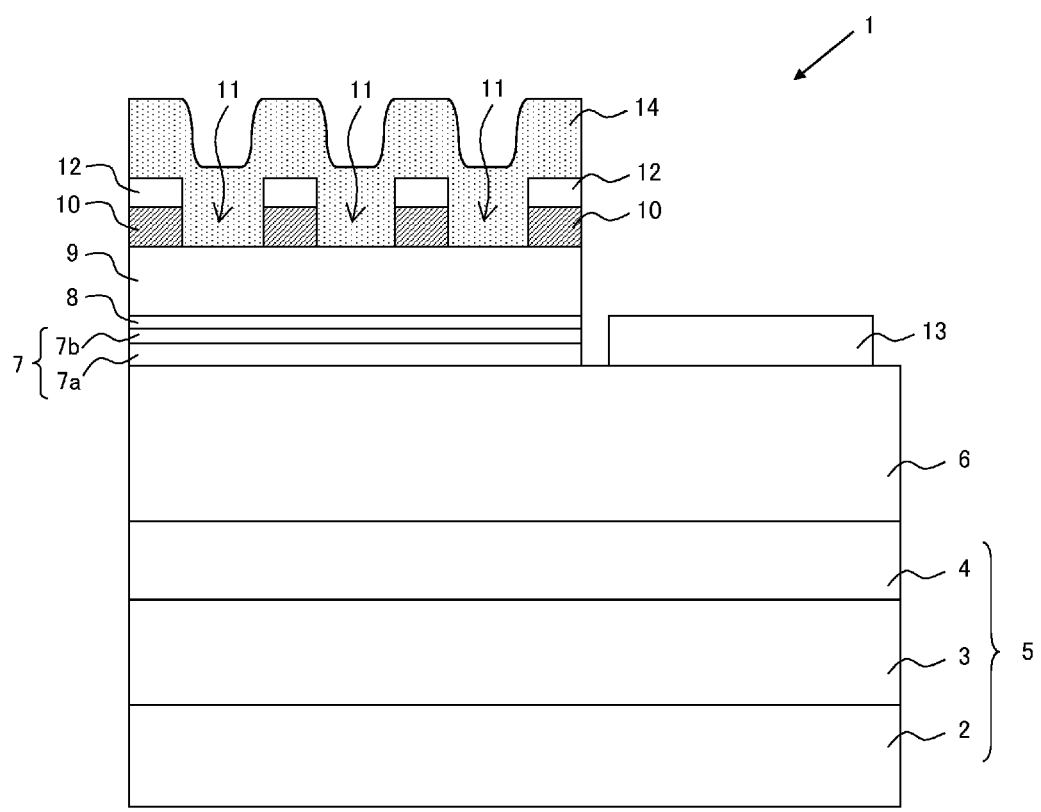
FIG. 8 is a cross sectional view schematically illustrating a laminated structure in a manufacturing step (after forming a reflective metal layer) of the nitride semiconductor ultraviolet light-emitting element according to the first embodiment of the present invention.

Subsequently, a photoresist (not illustrated) having a reverse pattern of that of the reflective metal layer 14 is formed on the entire surface of the substrate, a three-layer metal film of Al/Ti/Au serving as the reflective metal layer 14 is deposited thereon by an electron-beam evaporation method or the like, the three-layer metal film on the photoresist is exfoliated by removing the photoresist by a liftoff process, and, as illustrated in FIG. 8, the reflective metal layer 14 is formed substantially on an entire surface of the first region R1 in a manner to cover the p-electrode 12 and the p-type cladding layer 9 exposed in the opening portion 11. Film thicknesses of the three-layer metal film of Al/Ti/Au are, for example, 100 nm, 100 nm, and 200 nm, respectively, in this order. Here, no heat treatment is applied to the reflective metal layer 14. As a result, the Al layer in the reflective metal layer 14 is not melted by the heat treatment, and therefore a function of reflecting the ultraviolet ray is satisfactorily maintained. In addition, since the reflective metal layer 14 makes Ohmic contact with the p-electrode 12, it can be used as an electrode pad for wire bonding, flip-chip bonding, or the like.

Next, FIGS. 9A, 9B, 10A, 10B, and 11 illustrate measurement results of wavelength dependency of emission intensity LI (arbitrary unit), characteristics of a light emission output P (unit: mW) with respect to a forward current If (unit: mA), and current-voltage characteristics between a forward voltage Vf (unit: V) and the forward current If. These are measured in an example of the element 1 of the present invention, and a comparative example which has a p-type contact and a p-electrode structure similar to the conventional cross sectional structure having the p-type contact layer 10 and the p-electrode 12 formed on substantially the entire surface on the p-type cladding layer 9, is not provided with the reflective metal layer 14, and is exemplified in FIG. 26. The example and the comparative example both use p-type GaN as the p-type contact layer 10. A ratio of 67% is used as a ratio (aperture ratio) of the area of the opening portions 11 to a total area of the p-type contact layer 10 and the opening portions 11 in the example. This means that the p-electrode 12 is formed in about one third of the first region R1. Further, the AlN molar fraction of each AlGaN layer is, for example, 60% for the n-type cladding layer 6, 50% for the barrier layer 7a, 35% for the well layer 7b, 100% for the electron block layer 8, and 40% for the p-type cladding layer 9.

Figure 9A:
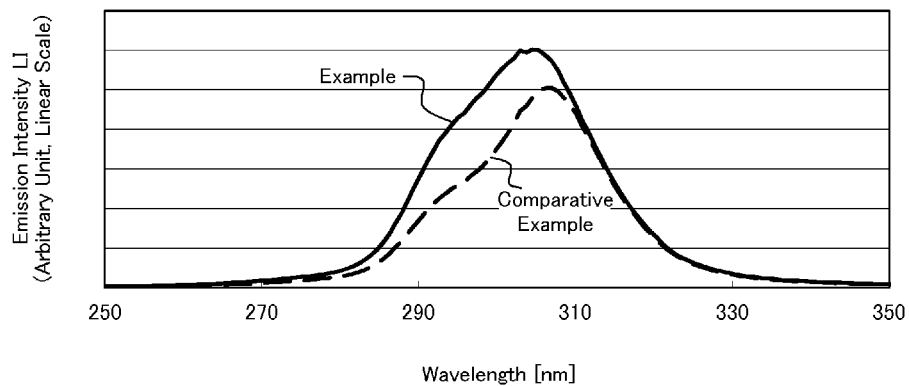
FIGS. 9A and 9B are characteristics charts indicating measurement results of wavelength dependency of emission intensity of one example of a nitride semiconductor ultraviolet light-emitting element according to the present invention and a comparative example which is provided with a p-type contact layer and a p-electrode on an entire p-type cladding layer but provided with no reflective metal layer.
Figure 9B:
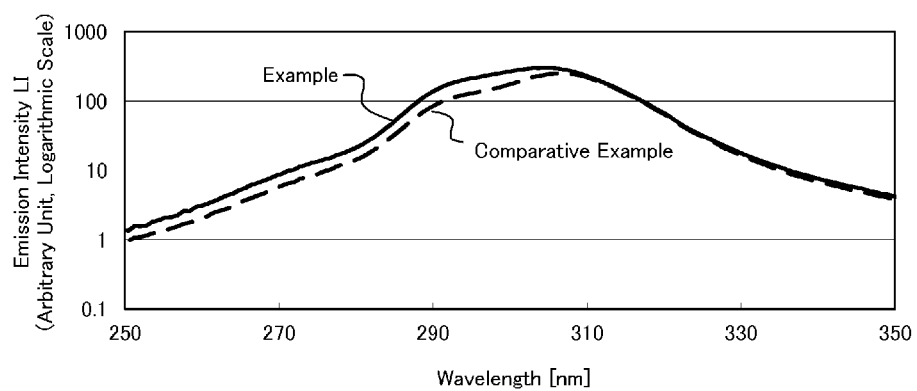
Figure 10A:
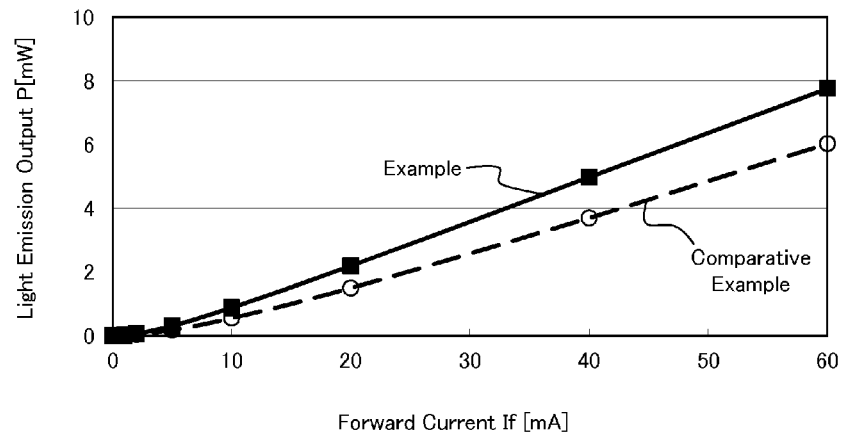
FIGS. 10A and 10B are characteristics charts indicating measurement results of characteristics of a light emission output with respect to a forward current of one example of a nitride semiconductor ultraviolet light-emitting element according to the present invention and a comparative example which is provided with a p-type contact layer and a p-electrode on an entire p-type cladding layer but provided with no reflective metal layer.
Figure 10B:
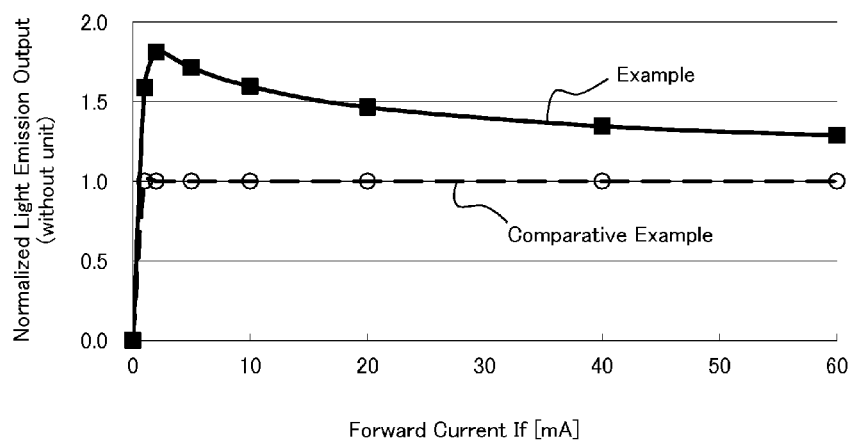
Figure 11:
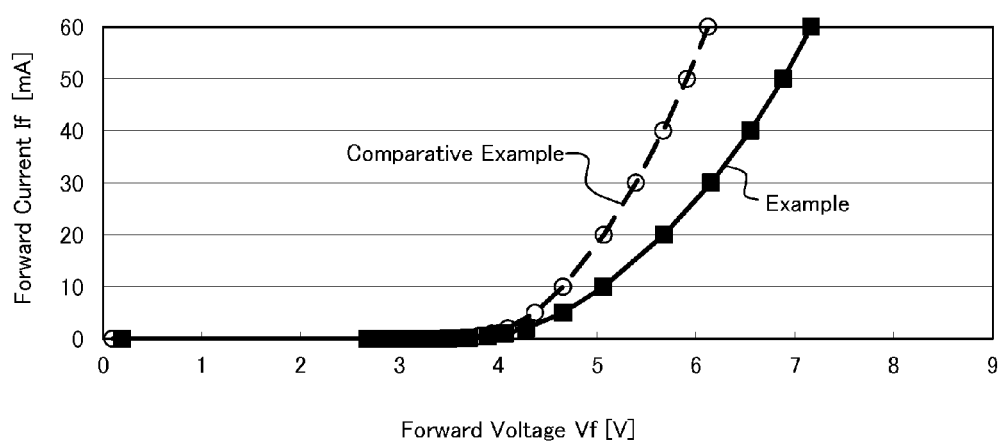
FIG. 11 is a characteristics chart indicating measurement results of current-voltage characteristics between a forward voltage and a forward current of one example of a nitride semiconductor ultraviolet light-emitting element according to the present invention and a comparative example which is provided with a p-type contact layer and a p-electrode on an entire p-type cladding layer but provided with no reflective metal layer.

FIGS. 9A and 9B illustrate the wavelength dependency when the emission intensity LI on the vertical axis is expressed by a linear scale and a logarithmic scale, respectively. Here, the forward current If is 60 mA in both the example and the comparative example. FIG. 10A illustrate characteristics of the light emission output P with respect to the forward current If, and FIG. 10B illustrates characteristics resulted from normalizing the same measurement result of the example by the measurement result of the comparative example. FIG. 11 illustrates current-voltage characteristics between the forward voltage Vf and the forward current If. In each of the drawings, the measurement result of the example is indicated by a solid line or a solid square mark (■), and the measurement result of the comparative example is indicated by a dotted line or a hollow circular mark (○).

According to the result illustrated in FIGS. 9A and 9B, the emission intensity LI of the example is noticeably increased on a shorter wavelength side than the center emission region as compared with the comparative example, and a peak emission wavelength is also slightly toward the shorter wavelength side. The peak wavelength of the comparative example is about 307.0 nm, and the emission intensity LI is about 252.5 (arbitrary unit). In contrast, the peak wavelength of the example is about 304.6 nm, and the emission intensity LI is about 301.0 (arbitrary unit). Based on the foregoing measurement results, an improvement of the external quantum efficiency over an entire emission wavelength band is confirmed. Further, based on the results illustrated in FIGS. 10A and 10B, the light emission output P of the example is increased more than that of the comparative example regardless of the forward current If, and therefore an improvement of the external quantum efficiency is confirmed.

However, although the external quantum efficiency of the example is improved as compared with the comparative example, the area of the p-type contact layer 10 becomes one third of that of the comparative example, the Ohmic contact area is reduced, therefore the parasitic resistance on the side of the p-electrode 12 is increased, and, as a result, the forward voltage Vf of the example is higher as illustrated in FIG. 11.

In view of this, FIG. 12 is a table indicating results of calculating the conversion efficiency E (generally referred to as wall plug efficiency) expressed by a ratio of the emission intensity P to the power (forward voltage Vf multiplied by forward current If) fed to the light-emitting element by measuring the emission intensity P and the forward voltage Vf when the forward current If is 60 mA. In the measurement indicated in FIG. 12, p-type GaN is used as the p-type contact layer 10 of both the example and the comparative example, and 67% is used as the aperture ratio in the example. However, three types of patterns having the same aperture ratio are prepared as the patterns of the p-type contact layer 10 and the p-electrode 12, and are used in Examples 1 to 3. Three samples are measured for each of Examples 1 to 3 and the comparative example, and an average value is indicated in FIG. 12. Here, the pattern for Example 1 is the grid pattern illustrated in FIG. 2B, the pattern for Example 2 is the comb-like pattern illustrated in FIG. 2C, and the pattern for Example 3 is the dot-like pattern illustrated in FIG. 2D.

According to FIG. 12, the average light emission output P of the three samples for the comparative example is 5.85 mW, the average forward voltage Vf is 6.23 V, and the average efficiency E is 1.57%. Whereas the average light emission output P of the three samples for Example 1 is 7.55 mW, the average forward voltage Vf is 7.41 V, and the average efficiency E is 1.70%; the average light emission output P of the three samples for Example 2 is 7.61 mW, the average forward voltage Vf is 7.90 V, and the average efficiency E is 1.61%; and the average light emission output P of the three samples for Example 3 is 7.70 mW, the average forward voltage Vf is 7.81 V, and the average efficiency E is 1.64%. The ratio of the light emission output P to that of the comparative example is 129% for Example 1, 130% for Example 2, and 132% for Example 3. In addition, the ratio of the forward voltage Vf to that of the comparative example is 119% for Example 1, 127% for Example 2, and 125% for Example 3. In all of Examples 1 to 3, an increase in the light emission output P is higher than the increase in the forward voltage Vf, and therefore the conversion efficiency E is higher in Examples 1 to 3 than that in the comparative example. In Examples 1 to 3, although the patterns of the p-type contact layer 10 and the p-electrode 12 are different from each other, the aperture ratio is the same. Accordingly, no large difference is found in the light emission output P and the forward voltage Vf among Examples 1 to 3, but there is a tendency that Example 3 has a good light emission output P, and Example 1 has a good conversion efficiency E. In addition, although 67% is used as the aperture ratio in these examples, as the aperture ratio is increased, the light emission output P naturally increases if forward voltage Vf remains the same, and the forward voltage Vf increases at the same time. In terms of the conversion efficiency E, an optimum aperture ratio is supposed to be present according to the structure of the light-emitting element, the manufacturing process, the electrical specifications, and the like. However, when the external quantum efficiency is focused, it is advantageous if the aperture ratio is larger. However, when the aperture ratio is too large, a patterning process of the p-type contact layer 10 and the p-electrode 12 cannot be performed, and it is possible that the forward voltage Vf becomes too high beyond the practical range. Therefore, there is an upper limit for this according to the structure of the light-emitting element, the manufacturing process, the electrical specifications, and the like.

Second Embodiment

The first embodiment describes that the external quantum efficiency can be improved by a novel p-electrode structure formed by combining a structure having the opening portion 11 of the p-type contact layer 10 and the p-electrode 12 with the reflective metal layer 14, i.e., by improving the electrode structure on a side of the p-electrode 12. However, as illustrated in FIGS. 11 and 12, the forward voltage Vf increases as a result of the improvement of the external quantum efficiency. In the second embodiment, a description will be given of an embodiment for reducing, on the side of the n-electrode 13, the increase of the forward voltage Vf caused on the side of the p-electrode 12.

Figure 13:
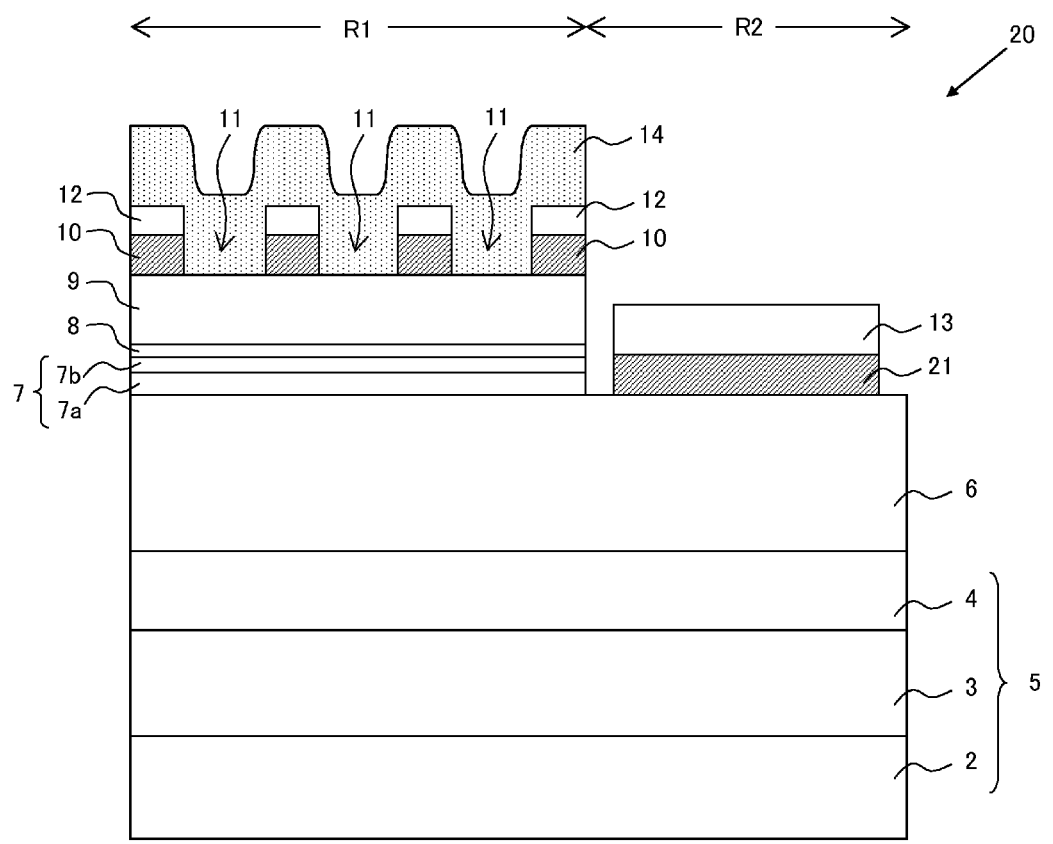
FIG. 13 is a cross sectional view schematically illustrating a laminated structure of a nitride semiconductor ultraviolet light-emitting element according to a second embodiment of the present invention.

FIG. 13 illustrates a cross sectional structure of an element 20 of the present invention according to the second embodiment. As illustrated in FIG. 13, the element 20 of the present invention is characterized in that an n-type contact layer 21 is provided on an n-type cladding layer 6 in a second region R2, and an n-electrode 13 is formed on the n-type contact layer 21, i.e., an n-electrode structure including a base structure and a peripheral structure of the n-electrode 13. The element 20 of the present invention is different, in respect of the portion of the n-electrode structure, from the element 1 of the present invention according to the first embodiment illustrated in FIG. 1, and is identical with the element 1 of the present invention in other respect. An AlN molar fraction of the n-type contact layer 21 is in a range from 0% to 60% (preferably, in a range from 0% to 40%, and more preferably, in a range from 0% to 25%), which is set to a value smaller than the AlN molar fraction of the n-type cladding layer 6. In addition, it is preferable that a difference between the molar fractions of the n-type contact layer 21 and the n-type cladding layer 6 be 10% to 20% or more, and further preferable that the n-type contact layer 21 be made of n-type GaN (AlN molar fraction of 0%).

Next, a method for manufacturing a portion of an n-electrode structure will be described with reference to FIGS. 14, 15A, 15B, 16, and 17. The processes described with reference to FIGS. 3 to 5 in the first embodiment are identical with those in the second embodiment, and therefore the overlapping descriptions thereof will not be repeated.

Figure 14:
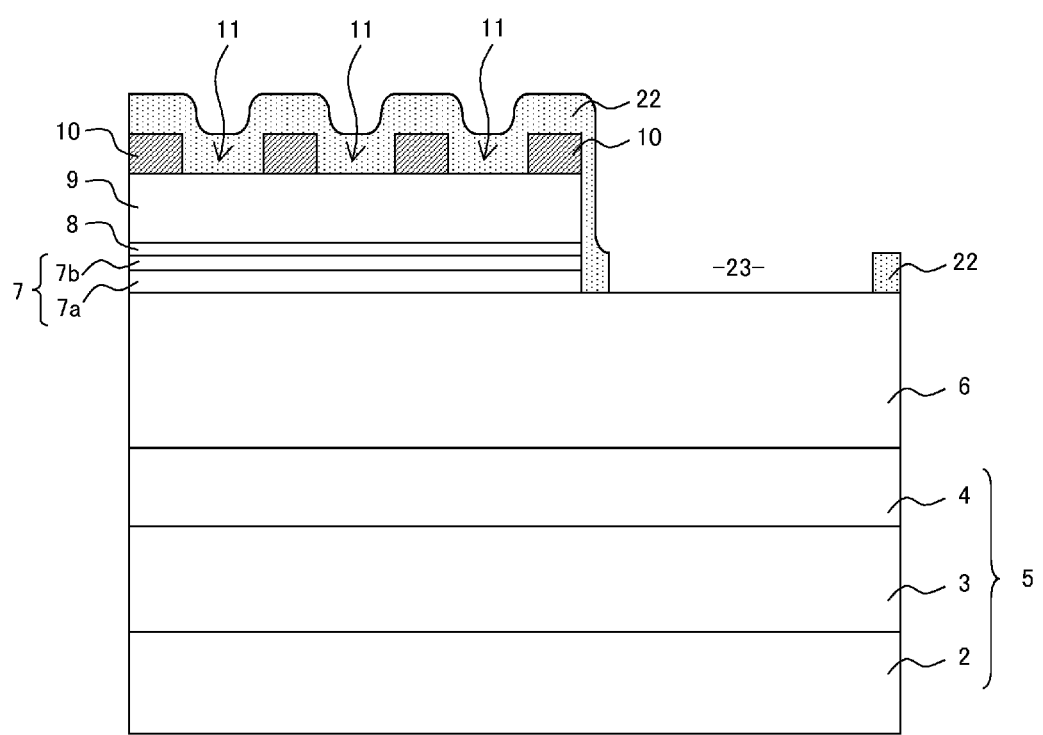
FIG. 14 is a cross sectional view schematically illustrating a laminated structure in a manufacturing step (after forming a mask for selective growth) of the nitride semiconductor ultraviolet light-emitting element according to the second embodiment of the present invention.

After a surface of the n-type cladding layer 6 located in the second region R2 is exposed, as illustrated in FIG. 14, an $SiO_2$ film 22, which is amorphous and serves as a mask for selective growth, is deposited to a thickness of 200 nm on an entire surface of a substrate by a well-known deposition method such as an electron beam evaporation method, a sputtering method, or a chemical vapor deposition (CVD) method; and an opening portion 23 is formed in the deposited $SiO_2$ film 22 in part of the second region by the well-known photolithography technique and etching method.

Subsequently, as illustrated in FIG. 15A, the n-type contact layer 21 of n-type GaN is selectively grown on the surface of the n-type cladding layer 6 that is exposed in a bottom portion of the opening portion 23 by the epitaxial growth method. Here, when n-type AlGaN (where molar fraction of Al is larger than 0) is used for the n-type contact layer 21, polycrystalline n-type AlGaN 24 is deposited on the $SiO_2$ film 22, as illustrated in FIG. 15B. If the n-type contact layer 21 is of n-type GaN, the $SiO_2$ film 22 is amorphous and has, on a surface thereof, little dangling bond that absorbs GaN molecules. Accordingly, the absorption energy is extremely small as compared with a surface (crystal face) of the n-type contact layer 21, migration of the GaN molecules is large, and therefore the n-type GaN grows exclusively on the surface of the n-type contact layer 21 having large absorption energy, but does not grow on the $SiO_2$ film 22 even as polycrystal. In contrast, if the n-type contact layer 21 is made of n-type AlGaN, AlN molecules have smaller migration as compared with the GaN molecules, have higher adherence onto the $SiO_2$ film 22, and therefore polycrystal having a composition containing AlN is deposited on the surface of the $SiO_2$ film 22.

Figure 16:
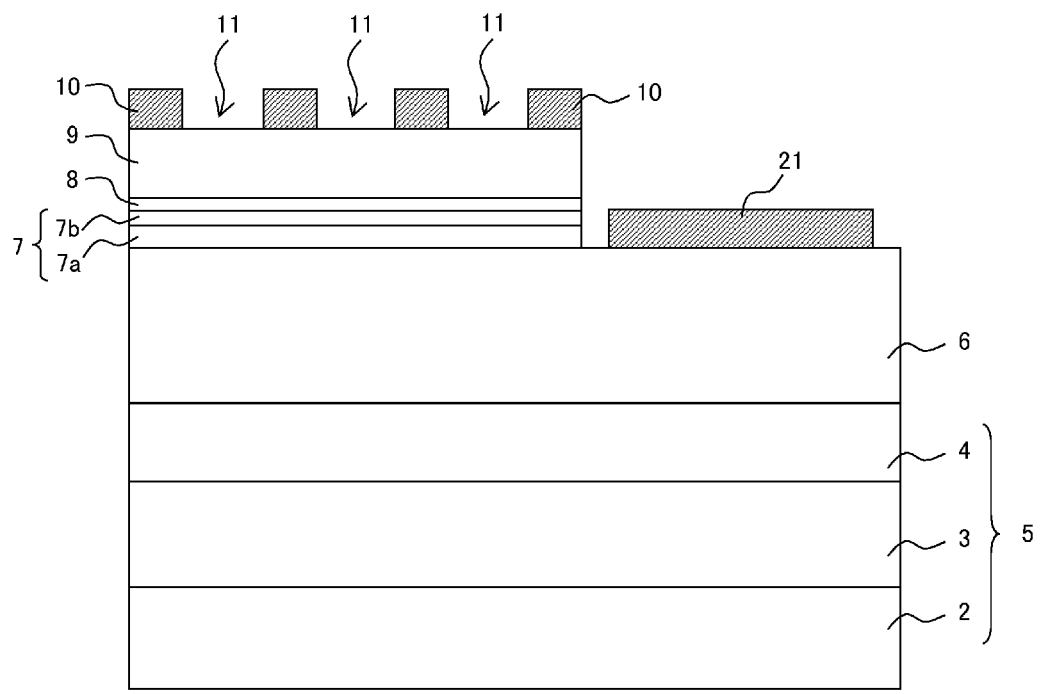
FIG. 16 is a cross sectional view schematically illustrating a laminated structure in a manufacturing step (after removing the mask for selective growth) of the nitride semiconductor ultraviolet light-emitting element according to the second embodiment of the present invention.
Figure 17:
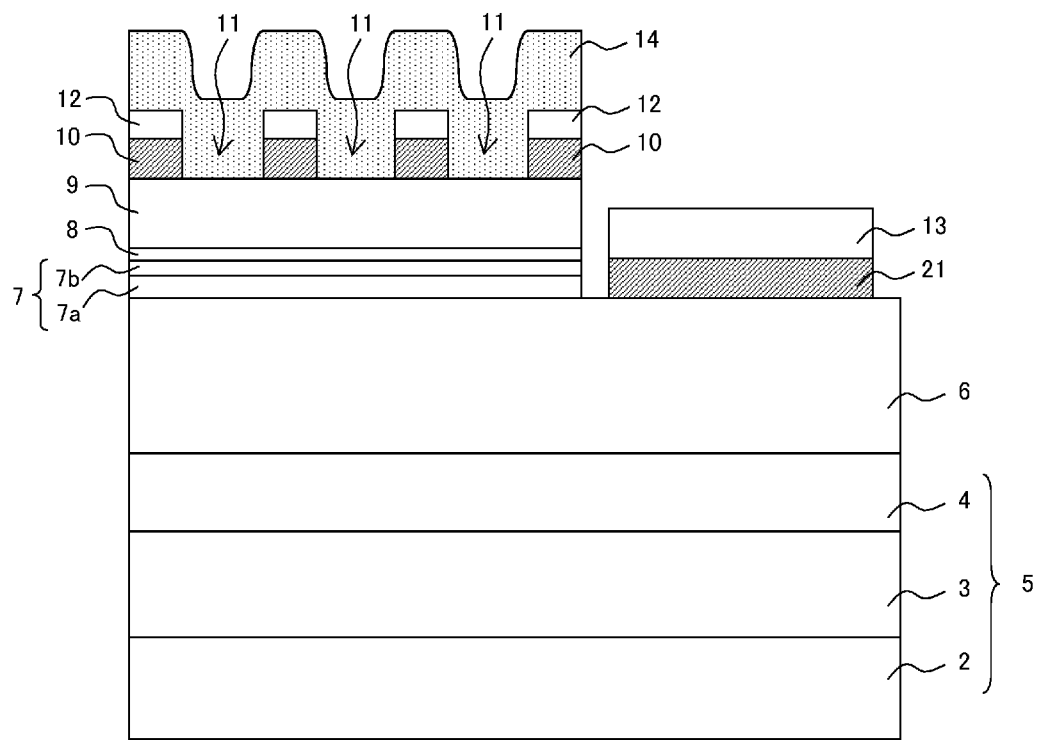
FIG. 17 is a cross sectional view schematically illustrating a laminated structure in a manufacturing step (after forming an n-type electrode) of the nitride semiconductor ultraviolet light-emitting element according to the second embodiment of the present invention.

Subsequently, as illustrated in FIG. 16, the $SiO_2$ film 22 is removed by wet etching using hydrofluoric acid or the like. During this process, if the n-type contact layer 21 is made of n-type AlGaN, the polycrystalline n-type AlGaN 24 grown on the $SiO_2$ film 22 is removed together with the $SiO_2$ film 22.

After the n-type contact layer 21 is formed on the n-type cladding layer 6 in the manner described above, as illustrated in FIG. 17, an n-electrode 13 is formed on the n-type contact layer 21 in the same manner as described in the first embodiment, then the p-electrode 12 is formed on the surface of the p-type contact layer 10, subsequently the reflective metal layer 14 is formed on an substantially entire surface in the first region R1 in a manner to cover the p-electrode 12 and the p-type cladding layer 9 that is exposed in the opening portion 11.

Next, the effect achieved by providing the n-type contact layer 21 will be described. In the example of the first embodiment, the case where the AlN molar fraction of the n-type cladding layer 6 is 60% is exemplified. However, when the center emission wavelength is shorter than 280 nm, for example, at about 250 nm, the AlN molar fraction of the n-type cladding layer 6 increases up to about 75%. A contact resistance between the n-type cladding layer 6 configured of an n-type AlGaN semiconductor layer and the n-electrode 13 having Al as a main component tends to increase when the AlN molar fraction of the n-type cladding layer 6 increases, and particularly, this becomes prominent when the molar fraction exceeds 60% (e.g., see Non-Patent Document 2). The increase in the contact resistance causes the forward voltage Vf to be applied between the p-electrode and the n-electrode to be increased, and this may cause an increase in power consumption, and, further, a reduction in life of the element due to an increase in an amount of heat generation by Joule heat.

However, according to the second embodiment, even if the AlN molar fraction of the n-type cladding layer 6 increases beyond 60% as a result of the center emission wavelength becoming a shorter wavelength, using n-type GaN or n-type AlGaN having a low AlN molar fraction for the n-type contact layer 21 makes it possible to avoid an increase in the contact resistance between the n-type contact layer 21 and the n-electrode 13, suppress an increase of the forward voltage Vf, and therefore operate with a lower voltage.

Figure 18:
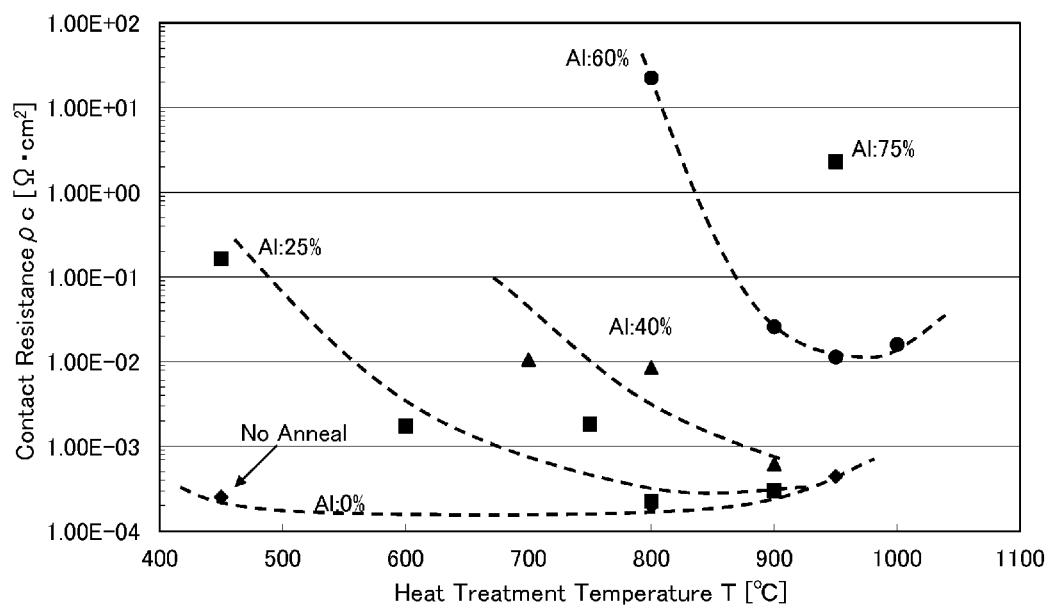
FIG. 18 is a characteristics chart indicating a measurement result of a relation among a contact resistance between an n-electrode formed on an n-type AlGaN layer and the n-type AlGaN layer, a heat treatment temperature T, and an AlN molar fraction of the n-type AlGaN layer.

FIG. 18 illustrates results of measurement of a relation between a contact resistance $\rho_C$ (unit: $\Omega cm^2$) between the n-electrode (Ti/Al/Ti/Au where lowermost layer is made of Ti, and uppermost layer is made of Au) formed on an n-type $Al_xGa_{1-x}N$ layer and the n-type AlGaN layer, and heat treatment temperature T (unit: °C.) for five cases where the AlN molar fraction x of the n-type AlGaN layer is 0%, 25%, 40%, 60%, and 75%. Each point illustrated in FIG. 18 is plotted using an average value of the contact resistances of a plurality of samples having an identical AlN molar fraction and subjected to an identical heat treatment temperature, and a curved broken line indicates a tendency of a change of the individual points for the sake of convenience. Here, the measurement of the contact resistance is conducted by the publicly known TLM (Transmission Line Modeling) method. The heat treatment temperature is set within a range from 450° C. to 1000° C., and a sample whose AlN molar fraction x is 0% is measured also in the case where no heat treatment is performed. The sample whose AlN molar fraction x is 0% presents the same contact resistance both in the case where the heat treatment is not performed and the case where the heat treatment is performed at a temperature of 450° C. As to the sample whose AlN molar fraction x is 75%, the contact resistance is 200 times larger or more in average at the heat treatment temperature of 950° C. as compared with the sample whose AlN molar fraction x is 60%, excellent Ohmic contact is not formed, and no Ohmic contact is provided at the heat treatment temperature of 900° C. or lower. Further, as to the sample whose AlN molar fraction x is 75%, a variation in the contact resistance is large, and furthermore a contact resistance which is higher by double digits is also measured.

From the measurement results illustrated in FIG. 18, it is understood that, for each of the AlN molar fractions x, a range of the heat treatment temperature T in which the contact resistance $\rho_C$ decreases to a minimum value or in the vicinity thereof is found; as the AlN molar fraction x is smaller, the range is distributed wider and in a lower-temperature zone; and as the AlN molar fraction x is larger, the range is distributed narrower and in a higher-temperature zone. In addition, when the heat treatment temperature T increases beyond the temperature range, the contact resistance $\rho_C$ increases; when the heat treatment temperature T decreases lower than the temperature range, the contact resistance $\rho_C$ also increases; and when the heat treatment temperature T decreases too low, the Ohmic contact cannot be formed. It is understood that, when the AlN molar fraction x is in the range from 0 to 0.6, proper selection of the heat treatment temperature T allows the contact resistance $\rho_C$ to be regulated to 0.01 $\Omega cm^2$ or lower.

As described above, by interposing the n-type contact layer 21 having the AlN molar fraction smaller than that of the n-type cladding layer 6 between the n-type cladding layer 6 and the n-electrode 13, it is possible to achieve both reduction in the contact resistance of the n-electrode 13 and reduction in the heat treatment temperature. The above-mentioned effect is particularly noticeable when the AlN molar fraction of the n-type cladding layer 6 exceeds 60%, by which the contact resistance of the n-electrode 13 becomes an extremely large value in the case where the n-electrode 13 is formed directly on the n-type cladding layer 6.

In the first embodiment described above, it is described that the heat treatment is applied by RTA (Rapid Thermal Annealing) or the like as required when the n-electrode 13 is formed. However, in the second embodiment, when the n-type contact layer 21 is made of n-type AlGaN, the contact resistance with the n-electrode 13 depends on the heat treatment temperature according to the measurement results illustrated in FIG. 18, and therefore the heat treatment is performed for the purpose of reducing the contact resistance. This is also the same in the first embodiment in which the n-electrode 13 is formed on the n-type cladding layer 6 of n-type AlGaN.

Further, in the process after the n-type contact layer 21 is formed, the p-electrode 12 and the reflective metal layer 14 are formed after the n-electrode 13 is formed. However, the n-electrode 13 may be formed after the p-electrode 12 is formed. In such a case, as illustrated in FIG. 18, when the n-type contact layer 21 is made of n-type GaN, the heat treatment temperature can be lowered to 450° C., or the heat treatment can be omitted. As a result, an adverse effect caused by the heat treatment during formation of the n-electrode 13 which is a post process performed after the p-electrode 12 is formed can be eliminated.

Figure 19:
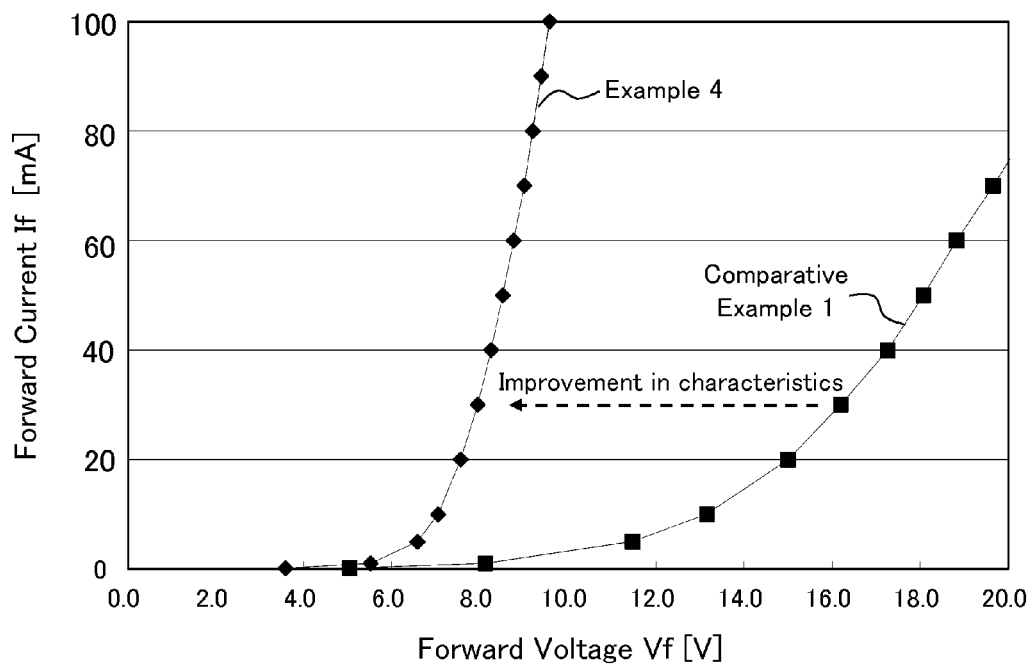
FIG. 19 is a characteristics chart indicating measurement results of current-voltage characteristics between a forward voltage Vf and a forward current If of one example of a nitride semiconductor ultraviolet light-emitting element according to a second embodiment of the present invention and a comparative example which is not provided with an n-type contact layer.

Next, FIG. 19 illustrates an experimental result obtained by measuring a difference between the forward voltage Vf in an example (Example 4) in which the n-type contact layer 21 is selectively grown on the surface of the n-type cladding layer 6, and the n-electrode 13 is formed thereon, and the forward voltage Vf in an comparative example (Comparative Example 1) in which the n-electrode 13 is directly formed on the surface of the n-type cladding layer 6. In this comparative experiment, Comparative Example 1 uses a sample in which the p-type contact layer 10 and the p-electrode 12 are formed on an substantially entire surface of the p-type cladding layer 9, as in the case of the comparative example used in the comparative experiment in the first embodiment, and the reflective metal layer 14 is not provided. For this reason, in order to check an influence caused by the difference in the portion of the n-electrode structure, Example 4 uses a sample in which the p-type contact layer 10 and the p-electrode 12 are formed on an substantially entire surface of the p-type cladding layer 9, and the reflective metal layer 14 is not provided as in the case of Comparative Example 1. The p-type contact layer 10 in Example 4 and Comparative Example 1 is formed using p-type GaN, the AlN molar fraction of the n-type cladding layer 6 is set to 75%, and the n-type contact layer 21 in Example 4 is formed using n-type GaN. Planar patterns of the n-type contact layer 21 in Example 4 and Comparative Example 1 are both the same as those illustrated in FIGS. 2A to 2D. From the result illustrated in FIG. 19, it is understood that the forward voltage Vf is drastically improved (lower voltage) by providing the n-type contact layer 21 in the element 20 of the present invention. As a result of this, an increase of the forward voltage Vf caused by the p-electrode structure adopted in the first embodiment is lessened or offset by the n-electrode structure adopted in the second embodiment. Accordingly, the effect of improving the external quantum efficiency in the present embodiment can be achieved in a wavelength band of a shorter wavelength.

Third Embodiment

The second embodiment describes that the forward voltage Vf is reduced by providing the n-type contact layer 21 in a wide area on the exposed surface of the n-type cladding layer 6 in the second region R2, and forming the n-electrode 13 on the n-type contact layer 21. A description will be given of a third embodiment which improves the external quantum efficiency not only in the portion of the p-electrode structure but also in the portion of the n-electrode structure.

Figure 20:
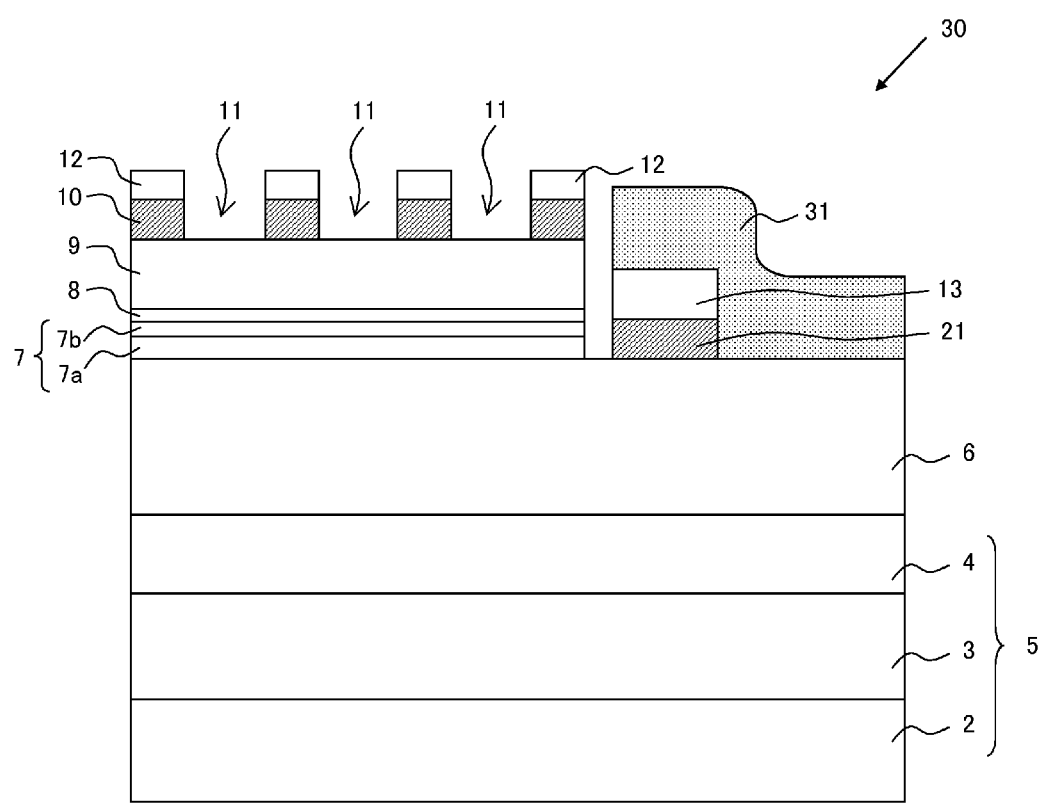
FIG. 20 is a cross sectional view schematically illustrating a laminated structure of a nitride semiconductor ultraviolet light-emitting element according to a third embodiment of the present invention.

FIG. 20 illustrates a cross sectional structure of an element 30 of the present invention according to the third embodiment. As illustrated in FIG. 20, the element 30 of the present invention is characterized in that an n-type contact layer 21 is provided on an n-type cladding layer 6 in a second region R2, an n-electrode 13 is formed on the n-type contact layer 21, and further a reflective metal layer 31 similar to the reflective metal layer 14 is formed on a surface of the n-type cladding layer 6 which is not covered with the n-type contact layer 21 and on the n-electrode 13, i.e., an n-electrode structure including a base structure and a peripheral structure of the n-electrode 13. Specifically, the element 30 of the present invention is different, in respect of the portion of the n-electrode structure, from the element 1 of the present invention according to the first embodiment illustrated in FIG. 1, and is identical with the element 1 of the present invention in other respect. In addition, the element 30 of the present invention is different from the element 20 of the present invention according to the second embodiment in the respect that the element 30 of the present invention is provided with the reflective metal layer 31. The n-type contact layer 21 and the n-electrode 13 are different only in respect of shapes and areas of planar patterns thereof, and are identical in other respect as compared with the second embodiment. Therefore, overlapping descriptions will not be repeated.

Figure 21A:
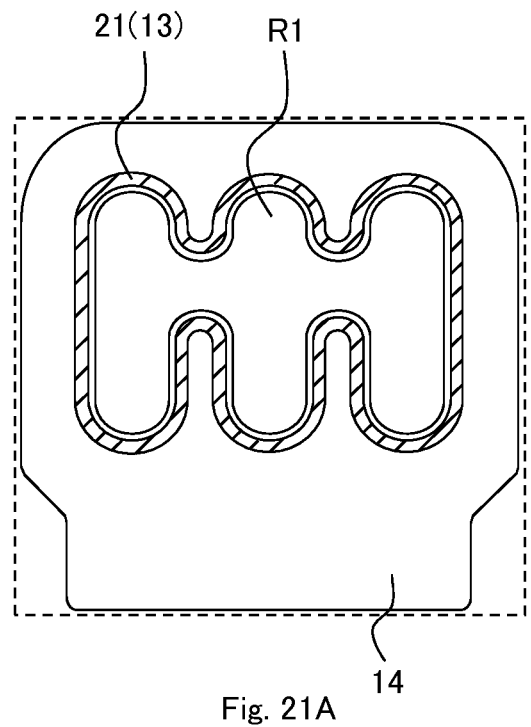
FIGS. 21A and 21B are plan views schematically illustrating a planar structure of a nitride semiconductor ultraviolet light-emitting element according to a third embodiment of the present invention and a planar pattern of an n-type contact layer and an n-electrode.
Figure 21B:
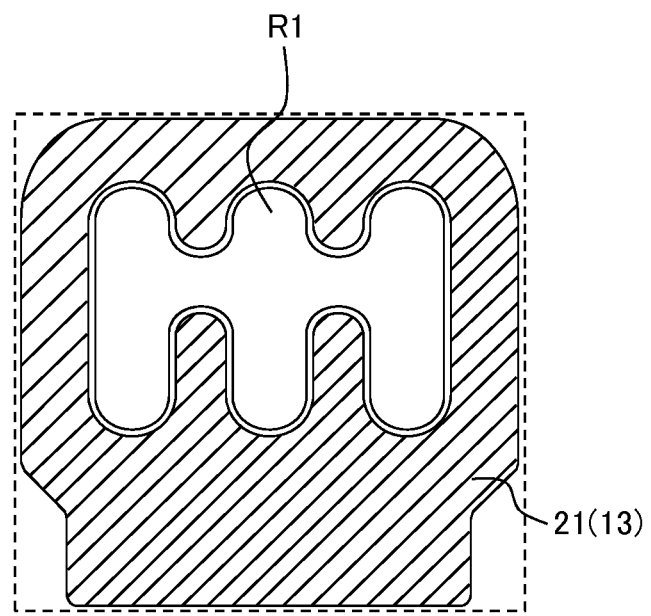

FIG. 21A illustrates one example of the planar patterns of the n-type contact layer 21 and the n-electrode 13 of the element 30 of the present invention. As illustrated in FIG. 21A, according to the element 30 of the present invention, the n-type contact layer 21(cross-hatching portion in the illustration) is formed along an outer periphery of the first region R1, and the n-electrode 13 is formed thereon. For reference, FIG. 21B illustrates planar patterns of the n-type contact layer 21 and the n-electrode 13 adopted in the elements 1 and 20 of the present invention in the first and second embodiments, respectively. The reflective metal layer 31 of the element 30 of the present invention includes the same planar pattern as those of the n-electrodes 13 of the elements 1 and 20 of the present invention. The p-type contact layer 10, the opening portion 11, and the p-electrode 12 are omitted in FIGS. 21A and 21B.

Next, a method for manufacturing the reflective metal layer 31 will be described. After the n-electrode 13 is formed according to the manner described in the first and second embodiments, a photoresist (not illustrated) having a reverse pattern of that of the reflective metal layer 31 is formed on an entire surface of the substrate, a three-layer metal film of Al/Ti/Au serving as the reflective metal layer 31 is deposited thereon by an electron-beam evaporation method or the like, the three-layer metal film on the photoresist is exfoliated by removing the photoresist by a liftoff process, and the reflective metal layer 31 is formed on an substantially entire surface in the second region in a manner to cover the n-electrode 13 (or at least part of the n-electrode 13), as illustrated in FIG. 20. Film thicknesses of the three-layer metal film of Al/Ti/Au are, for example, 100 nm, 100 nm, and 200 nm, respectively, in this order, as in the case of the reflective metal layer 14 of the p-electrode structure. The reflective metal layer 31 formed directly on the n-type cladding layer 6 without coating the n-electrode 13 chiefly contains Al that reflects the ultraviolet ray. Accordingly, the reflective metal layer 31 reflects again, toward the side of the sapphire substrate 2, light emission that is reflected by a side of a sapphire substrate 2, passes through the n-type cladding layer 6, and reaches the second region on the surface of the n-type cladding layer 6. Here, heat treatment is not applied to the reflective metal layer 31. As a result, the Al layer in the reflective metal layer 31 is not melted by the heat treatment, and therefore a function of reflecting the ultraviolet ray is satisfactorily maintained. In addition, since the reflective metal layer 31 makes Ohmic contact with the n-electrode 13, the reflective metal layer 31 can be used as an electrode pad for wire bonding, flip-chip bonding, or the like in the vicinity of the chip.

Here, the reflective metal layer 14 and the reflective metal layer 31 are not required to have the same composition and structure. For example, one of them may be an Al single layer film, and the other may be a three-layer film of Ai/Ti/Au. Further, although the reflective metal film 14 is formed after formation of the p-electrode 12, two of the reflective metal layers 14 and 31 may be simultaneously formed after formation of the p-electrode 12.

Figure 22:
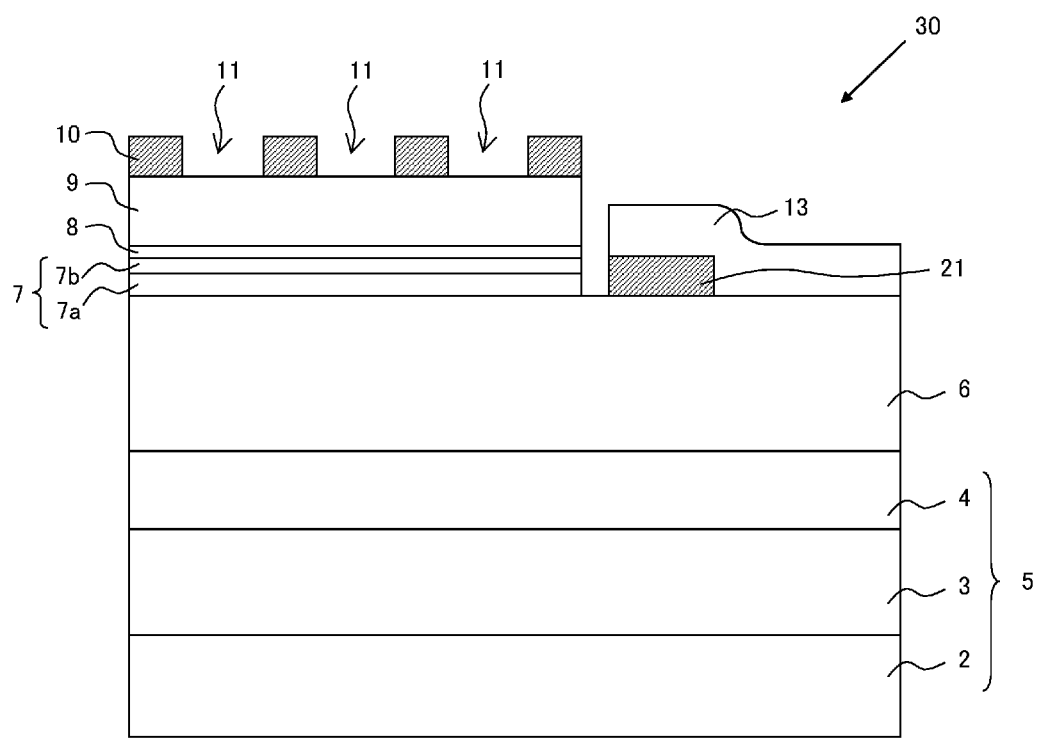
FIG. 22 is a cross sectional view schematically illustrating a laminated structure of a nitride semiconductor ultraviolet light-emitting element according a modified example of the third embodiment of the present invention.

Further, the embodiment for individually forming the n-electrode 13 and the reflective metal layer 31 is described in the method for manufacturing the element 30 of the present invention as described above. However, it is also a preferable embodiment to form, instead of forming the reflective metal layer 31, the n-electrode 13 not only on the n-type contact layer 21 but also on the n-type cladding layer 6 which is not covered with the n-type contact layer 21, as illustrated in FIG. 22. In such a case, it is preferable that the AlN molar fraction of the n-type contact layer 21 be set to 25% or smaller, and the heat treatment temperature during formation of the n-electrode 13 be set to 600° C. or lower. It is further preferable to form the n-type contact layer 21 using n-type GaN, and omit the heat treatment. With this arrangement, the contact resistance between the n-electrode 13 and the n-type contact layer 21 is reduced to form excellent Ohmic contact, the Al layer in the n-electrode 13 is not melted by the heat treatment, and therefore the n-electrode 13 on the n-type cladding layer 6 can excellently provide a function of reflecting the ultraviolet ray.

As a result of measuring the light emission output P and the forward voltage Vf of the element 30 of the present invention that is provided with the reflective metal layer 31, and of the element 20 of the present invention that is not provided with the reflective metal layer 31, the light emission output P of the element 30 of the present invention is improved by an average of about 20% and more as compared with the light emission output P of the element 20 of the present invention. In contrast, no large difference is found in the forward voltage Vf between the element 30 of the present invention and the element 20 of the present invention. As a result of this, it is understood that it is sufficient if the n-type contact layer 21 is formed along an outer periphery of the first region R1. In addition, since the light emission output P of the element 30 of the present invention is improved as compared with that of the element 20 of the present invention, it is understood that the light emission output P is improved by suppressing an area of the n-type contact layer 21, and, instead, providing the reflective metal layer 31, i.e., the external quantum efficiency is improved. To state it differently, if the light emission output P is same, it is possible to reduce a chip size by reducing the area of the n-type contact layer 21 to the minimum as required without providing the reflective metal layer 31. For example, in the element 30 of the present invention illustrated in FIG.

21A, if the reflective metal layer 31 is not provided, it is possible that the chip size is reduced to a size of 640 μm by 480 μm, and the first region R1 accounts for 50% or more of a chip area.

Hereinafter, another embodiment will be described.

Figure 23:
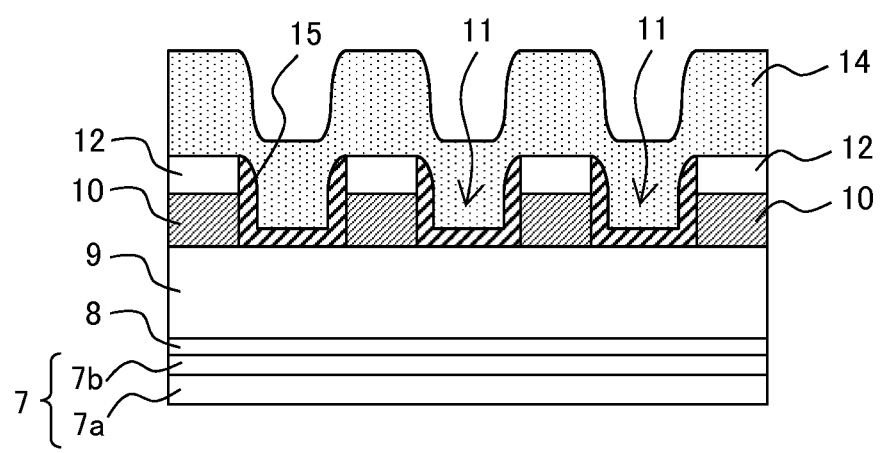
FIG. 23 is a cross sectional view schematically illustrating a principal portion of a laminated structure of a nitride semiconductor ultraviolet light-emitting element according to another embodiment of the present invention.

(1) In each of the embodiments described above, the case for forming the reflective metal layer 14 directly on the surface of the p-type cladding layer 9 in the opening portion 11 is described. However, as illustrated in FIG. 23, for example, after a transparent insulating film 15, such as $SiO_2$, AlN, or $HfO_2$, which allows the ultraviolet ray (particularly, the ultraviolet ray in the emission wavelength band) to pass therethrough is deposited in the opening portion 11, the reflective metal layer 14 may be formed.

Furthermore, in the second and third embodiments, since the $SiO_2$ film 22 allows the emitted light from the active layer 7 to pass therethrough, the $SiO_2$ film 22 in the opening portion 11 of the p-type contact layer 10 may not be completely removed and may be left in the opening portion 11.

(2) In each of the embodiments described above, after the p-type contact layer 10 is formed on the entire surface of the p-type cladding layer 9, the opening portion 11 is formed by partially removing the p-type contact layer 10. However, instead of this, after forming a mask for selective growth such as $SiO_2$ or the like in a portion to be formed as the opening portion 11 on the p-type cladding layer 9, the p-type contact layer 10 of p-type GaN may be selectively grown on the p-type cladding layer 9, and a portion of the mask for selective growth may be formed as the opening portion 11. In this case, since the insulating film such as $SiO_2$ that allows the ultraviolet ray to pass therethrough is used for the mask portion, it is possible to form the reflective metal layer 14 thereon without removing the mask portion.

Figure 24:
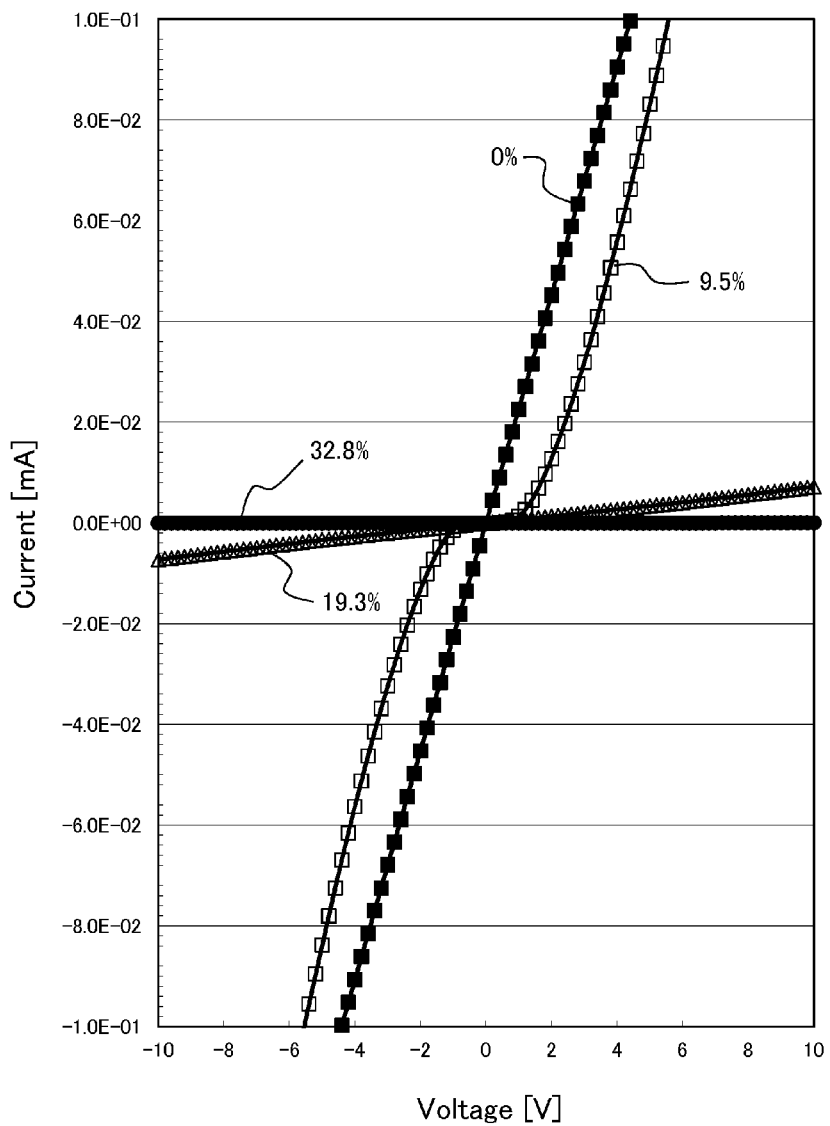
FIG. 24 is a chart indicating current-voltage characteristics of four different kinds of AlN molar fractions at an interface between a p-type contact layer and a p-electrode.

(3) In each of the embodiments described above, although p-type GaN is used for the p-type contact layer 10, p-type AlGaN can be used if the AlN molar fraction thereof is smaller than 10%, and can make non-rectifying contact with the p-electrode with a low resistance. FIG. 24 illustrates AlN molar fraction dependency of current-voltage characteristics indicating contact resistance characteristics at an interface between the p-electrode and p-type AlGaN used in the present embodiment. Here, the current value on the vertical axis in FIG. 24 represents a relative value. It is understood that p-type GaN having an AlN molar fraction of 0% indicates an excellent Ohmic characteristic with a low resistance. Further, p-type AlGaN having an AlN molar fraction of 9.5% indicates a varistor-like non-linear current-voltage characteristic. However, it is understood that, with application of a voltage of 1 V or higher, it indicates a low resistance and non-rectifying resistance characteristic. In contrast, p-type AlGaN having an AlN molar fraction of 19.3% has a resistance which is 30 times as large as that of p-type GaN or more, and therefore is not practical. In addition, p-type AlGaN having an AlN molar fraction of 32.8% has a resistance which is higher by about four digits as compared with that of p-type GaN, and therefore cannot be used.

Figure 25:
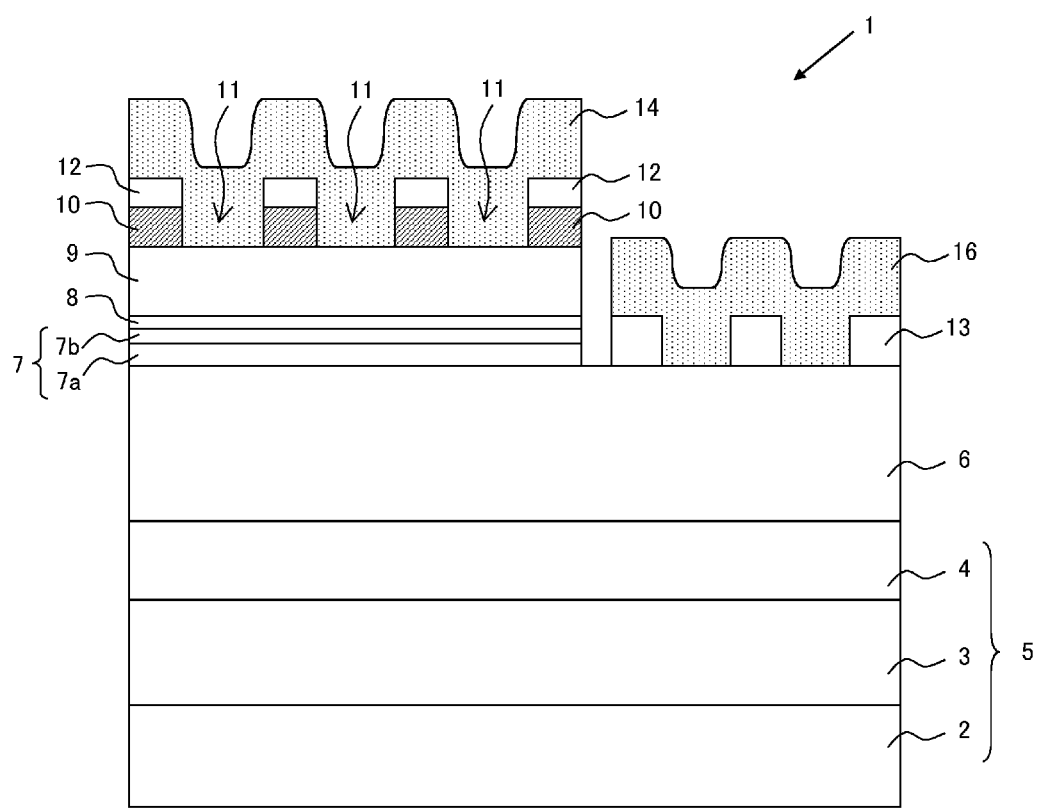
FIG. 25 is a cross sectional view schematically illustrating a laminated structure of a nitride semiconductor ultraviolet light-emitting element according to another embodiment of the present invention.

(4) In the first embodiment, the n-electrode 13 formed on the n-type cladding layer 6 is formed in the same manner as the element structure of the conventional light-emitting diode illustrated in FIG. 26. However, as illustrated in FIG. 25, for example, it is also preferable to form the planar shape of the n-electrode 13 into a pattern in which the surface of the n-type cladding layer 6 is partially exposed as in the case of the p-electrode 12, and form a reflective metal layer 16 which is similar to the reflective metal layer 14 on the surface of the n-type cladding layer 6 thus exposed and on the n-electrode 13. By providing the reflective metal layer 16 in addition to the reflective metal layer 14, for example, emitted light, which is reflected from a side of the sapphire substrate 2, passes through the n-type cladding layer 6, and reaches the second region R2 on the surface of the n-type cladding layer 6, is partially reflected again toward the side of the sapphire substrate 2. Accordingly, the external quantum efficiency is further improved. Here, the reflective metal layer 14 and the reflective metal layer 16 do not necessarily have the same composition and structure. For example, one of them may be an Al single layer film, and the other may be a three-layer film of Al/Ti/Au. Further, although the reflective metal film 14 and the reflective metal film 16 are formed after formation of the p-electrode 12, order of forming two of the reflective metal layers 14 and 16 is not particularly a matter, and the two may be formed simultaneously.

(5) In the embodiments described above, the description is given assuming that the element of the present invention is a light-emitting diode. For a semiconductor laser (laser diode), in the case where a contact resistance of an n-electrode becomes high by forming the n-electrode directly on an n-type cladding layer of n-type AlGaN, it is possible to reduce the contact resistance of the n-electrode by providing an n-type contact layer having a small AlN molar fraction on the n-type cladding layer as in the cases of the embodiments described above, and improve the electrical characteristics and the like similarly.

(6) In the embodiments described above, the template 5 illustrated in FIG. 1 is used as an example that constitutes the element 1 of the present invention. However, this is not limited to the template 5, and, for example, an ELO-AlN layer illustrated in FIG. 26 may be used as the AlN layer 3, the AlGaN layer 4 may be omitted, or further another substrate may be used instead of the sapphire substrate 2. Further, the film thickness and the AlN molar fraction of each film of AlGaN or GaN that constitutes the elements of the present invention exemplified in the embodiments described above is one example, and can be arbitrarily changed according to the specifications of the element. Furthermore, in the embodiments described above, a case where an electron block layer 8 is provided is indicated as an example, the electron block 8 may not necessarily be provided.

(7) In each of the embodiments described above, cases where the p-electrode 12 is made of Ni/Au, the n-electrode 13 is made of Ti/Al/Ti/Au, the reflective metal layers 14 and 31 are made of Al/Ti/Au are described as examples, the material and the film thickness of each of the electrodes and the reflective metal layers is not limited to the foregoing. An electrode material for the p-electrode 12 and the n-electrode 13 may be a metal material that can make Ohmic contact (or non-rectifying contact with a low resistance) with the p-type contact layer 10, and the n-type cladding layer 6 or the n-type contact layer 21 which are the base layers thereof, respectively, may have a structure which is not a multilayer structure as described above, and further may have a structure in which the layer structure thereof is alloyed by heat treatment. In the case where the reflective metal layer 31 is not particularly provided, it is preferable that the n-electrode 13 include a metal, which reflects the ultraviolet ray, for example, a metal containing Al as a main component. The example for using Ti for the n-electrode 13 as a metallic material (adherence layer) for increasing adherence with the n-type cladding layer 6 or the n-type contact layer 21 is described. However, Cr may be used instead of Ti, or such adherence layer may not necessarily be provided. The reflective metal layers 14 and 31 need to include a metal that reflects the ultraviolet ray, for example, a metal containing Al as a main component, but may not necessarily make Ohmic contact with the base layer.

(8) In each of the embodiments described above, when the reflective metal layer 14 is formed, the reflective metal layer 14 is formed on an substantially entire surface of the first region in a manner to cover the p-electrode 12. However, it is also a preferable embodiment to form the reflective metal layer 14 on a side wall surface of the laminated body in a range from the active layer 7 to the p-type contact layer 10 that are formed in the first region. In such a case, it is necessary to form a side wall insulating film using $SiO_2$ or the like between the side wall surface of the laminated body and the reflective metal layer 14 to prevent each layer of the laminated body from electrically establishing a short circuit. The side wall insulating film is formed by depositing an insulating film using $SiO_2$ or the like on an entire surface of the substrate after formation of the p-electrode 12, and removing the insulating film thus deposited by anisotropic etching, so that the insulating film remaining on the side wall surface of the laminated body is formed as the side wall insulating film. After the side wall insulating film is formed, a photoresist having a reverse pattern of that of the reflective metal layer 14 is formed on an entire surface of the substrate without covering the side wall insulating film, and the reflective metal layer 14 covering the side wall surface of the laminated body is formed through depositing of a material film of the reflecting metal layer 14, and a liftoff process of the photoresist according to the manner described.

(9) In the third embodiment described above, when the reflective metal layer 31 is formed, it is formed on substantially entire surface of the second region in a manner to cover the n-electrode 13. However, it is also a preferable embodiment to also form the reflective metal layer 31 on the side wall surface of the laminated body formed in a range from the active layer 7 to the p-type contact layer 10 that are formed in the first region. In such a case, it is necessary to form a side wall insulating film using $SiO_2$ or the like between the side wall surface of the laminated body and the reflective metal layer 31 to prevent each layer of the laminated body from electrically establishing a short circuit. Formation of the side wall insulator film and the reflective metal layer 31 is similar to that described in (8) above, and therefore an overlapping description will not be repeated.

INDUSTRIAL APPLICABILITY

The nitride semiconductor ultraviolet light-emitting element according to the present invention can be used for a light-emitting diode, a laser diode, and the like having a center emission wavelength of 355 nm or smaller, and is effective for improving external quantum efficiency.

EXPLANATION OF REFERENCES 1, 20, 30: nitride semiconductor ultraviolet light-emitting element
2, 101: sapphire substrate
3: MN layer
4: AlGaN layer
5: template
6, 104: n-type cladding layer (n-type AlGaN)
7: active layer
7a: barrier layer
7b: well layer
8, 106: electron block layer (p-type AlGaN)
9, 107: p-type cladding layer (p-type AlGaN)
10, 108: p-type contact layer (p-type GaN)
11, 23: opening
12, 109: p-electrode
13, 110: n-electrode
14, 16, 31: reflective metal layer
15: transparent insulating film
21: n-type contact layer
22: $SiO_2$ film
24: polycrystalline n-type AlGaN
102: underlying layer (AlN)
103: ELO-AlN layer
105: multi-quantum well active layer
R1: first region
R2: second region

The invention claimed is:

1. A nitride semiconductor ultraviolet light-emitting element, formed by laminating at least an n-type cladding layer configured of an n-type AlGaN semiconductor layer, an active layer including an AlGaN semiconductor layer having band gap energy of 3.4 eV or larger, and a p-type cladding layer configured of a p-type AlGaN semiconductor layer, wherein
a p-type contact layer configured of a p-type AlGaN semiconductor layer that absorbs ultraviolet light emitted from the active layer is formed on the p-type cladding layer,
the p-type contact layer has an opening portion penetrating through to a surface of the p-type cladding layer,
a p-electrode metal layer that makes Ohmic contact or non-rectifying contact with the p-type contact layer is formed on the p-type contact layer in a manner not to completely block the opening portion,
a reflective metal layer for reflecting the ultraviolet light is formed at least on the opening portion, and
the reflective metal layer covers the surface of the p-type cladding layer that is exposed through the opening portion either directly or through a transparent insulating layer that allows the ultraviolet light to pass therethrough.

2. The nitride semiconductor ultraviolet light-emitting element according to claim 1, wherein an AlN molar fraction of the p-type contact layer is 0% or larger and smaller than 10%.

3. The nitride semiconductor ultraviolet light-emitting element according to claim 1, wherein the reflective metal layer is formed at least on the opening portion and the p-electrode metal layer.

4. The nitride semiconductor ultraviolet light-emitting element according to claim 1, wherein the reflective metal layer is configured of Al, or a metal multilayer film or an alloy including Al as a main component.

5. The nitride semiconductor ultraviolet light-emitting element according to claim 1, wherein a ratio of an area of the opening portions to a total area of the p-type contact layer and the opening portions is 66% or larger.

6. The nitride semiconductor ultraviolet light-emitting element according to claim 1, wherein
the active layer, the p-type cladding layer, the p-type contact layer, and the reflective metal layer are formed in a first region on the n-type cladding layer in a plane parallel to a surface of the n-type cladding layer,
an n-type contact layer configured of an n-type AlGaN semiconductor layer is formed in at least part of a second region other than the first region on the n-type cladding layer,
an AlN molar fraction of the n-type contact layer is in a range of 0% or larger and 60% or smaller, and is smaller than an AlN molar fraction of the n-type cladding layer, and an n-electrode which makes Ohmic contact or non-rectifying contact with the n-type contact layer is formed on the n-type contact layer.

7. The nitride semiconductor ultraviolet light-emitting element according to claim 6, wherein the n-type contact layer is re-grown and formed on at least a surface of part of the n-type cladding layer in the second region.

8. The nitride semiconductor ultraviolet light-emitting element according to claim 6, wherein the n-electrode includes, as a main component, a metal that reflects the ultraviolet light.

9. The nitride semiconductor ultraviolet light-emitting element according to claim 8, wherein the n-electrode is configured of a metal multilayer film or an alloy including Al as a main component.

10. The nitride semiconductor ultraviolet light-emitting element according to claim 6, wherein the n-electrode is partially formed in a portion on the n-type cladding layer and in the second region where the n-type contact layer is not formed.

11. The nitride semiconductor ultraviolet light-emitting element according to claim 6, wherein a reflective metal layer including, as a main component, a metal that is electrically connected to the n-electrode and that reflects the ultraviolet light is formed in a portion on the n-type cladding layer and in the second region where the n-type contact layer is not formed.

12. The nitride semiconductor ultraviolet light-emitting element according to claim 1, wherein
the n-type cladding layer is formed on a template allowing the ultraviolet light to pass therethrough and configured of an insulator layer, a semiconductor layer, or a laminated body of the insulator layer and the semiconductor layer.

13. The nitride semiconductor ultraviolet light-emitting element according to claim 12, wherein the template includes an AlN layer.

* * * * *